United States Patent
Grossman et al.

(10) Patent No.: US 11,593,533 B2
(45) Date of Patent: Feb. 28, 2023

(54) TECHNIQUES FOR VISUALIZING AND EXPLORING LARGE-SCALE GENERATIVE DESIGN DATASETS

(71) Applicant: AUTODESK, INC., San Francisco, CA (US)

(72) Inventors: Tovi Grossman, Toronto (CA); Erin Bradner, San Francisco, CA (US); George Fitzmaurice, Toronto (CA); Ali Baradaran Hashemi, Toronto (CA); Michael Glueck, Toronto (CA); Justin Frank Matejka, Newmarket (CA)

(73) Assignee: AUTODESK, INC., San Francisco, CA (US)

( * ) Notice: Subject to any disclaimer, the term of this patent is extended or adjusted under 35 U.S.C. 154(b) by 164 days.

(21) Appl. No.: 16/358,635

(22) Filed: Mar. 19, 2019

(65) Prior Publication Data
US 2019/0325099 A1   Oct. 24, 2019

Related U.S. Application Data

(60) Provisional application No. 62/661,461, filed on Apr. 23, 2018.

(51) Int. Cl.
*G06F 3/048* (2013.01)
*G06F 30/00* (2020.01)
(Continued)

(52) U.S. Cl.
CPC ............ *G06F 30/00* (2020.01); *G06F 3/0482* (2013.01); *G06F 3/04815* (2013.01);
(Continued)

(58) Field of Classification Search
CPC .......... G06F 30/00; G06F 30/17; G06F 30/23; G06F 16/24578; G06F 3/04815; G06F 3/04845; G06F 3/0482; G06T 15/005
See application file for complete search history.

(56) References Cited

U.S. PATENT DOCUMENTS

| | | |
|---|---|---|
| 6,532,022 B1 | 3/2003 | Ahmad |
| 6,891,533 B1 | 5/2005 | Alcorn et al. |

(Continued)

FOREIGN PATENT DOCUMENTS

| | | |
|---|---|---|
| JP | 2010-061439 A | 3/2010 |
| JP | 2017-146888 A | 8/2017 |
| WO | 02/103581 A2 | 12/2002 |

OTHER PUBLICATIONS

"Here's What You Get When You Design a Chair With Algorithms", Wired, https://www.wired.com/2016/10/elbo-chair-autodesk-algorithm/, Oct. 3, 2016, 8 pages.

(Continued)

*Primary Examiner* — Aleksey Olshannikov
(74) *Attorney, Agent, or Firm* — Artegis Law Group, LLP

(57) ABSTRACT

A design application is configured to visualize and explore large-scale generative design datasets. The design explorer includes a graphical user interface (GUI) engine that generates a design explorer, a composite explorer, and a tradeoff explorer. The design explorer displays a visualization of a multitude of design options included in a design space. The design explorer allows a user to filter the design space based on input parameters that influence a generative design process as well as various design characteristics associated with the different design options. The composite explorer displays a fully interactive composite of multiple different design options. The composite explorer exposes various tools that allow the user to filter the design space via interactions with the composite. The tradeoff explorer displays a tradeoff space based on different rankings of design options. The different rankings potentially correspond to competing design characteristics specified by different designers.

22 Claims, 12 Drawing Sheets

(51) Int. Cl.
| | |
|---|---|
| *G06F 3/04815* | (2022.01) |
| *G06F 3/04845* | (2022.01) |
| *G06F 3/0482* | (2013.01) |
| *G06F 16/2457* | (2019.01) |
| *G06T 15/00* | (2011.01) |
| *G06F 30/17* | (2020.01) |
| *G06F 30/23* | (2020.01) |

(52) U.S. Cl.
CPC .... *G06F 3/04845* (2013.01); *G06F 16/24578* (2019.01); *G06F 30/17* (2020.01); *G06F 30/23* (2020.01); *G06T 15/005* (2013.01)

(56) References Cited

U.S. PATENT DOCUMENTS

| | | | | |
|---|---|---|---|---|
| 2005/0200623 | A1* | 9/2005 | Smith | G06T 19/20 345/419 |
| 2010/0253697 | A1* | 10/2010 | Rivera | G06T 15/503 345/589 |
| 2010/0325599 | A1* | 12/2010 | Perry | H02M 3/156 716/122 |
| 2013/0198207 | A1* | 8/2013 | Dolan | G16H 50/20 707/749 |
| 2016/0092606 | A1* | 3/2016 | Basudhar | G06F 30/00 703/1 |
| 2016/0147217 | A1 | 5/2016 | Davis et al. | |
| 2016/0147913 | A1 | 5/2016 | Bergin et al. | |
| 2016/0147914 | A1 | 5/2016 | Bergin et al. | |
| 2016/0241744 | A1 | 8/2016 | Xu et al. | |
| 2021/0259342 | A1 | 8/2021 | Bell et al. | |

OTHER PUBLICATIONS

Project Dreamcatcher | Autodesk Research, from https://autodeskresearch.com/projects/dreamcatcher, Retrieved Apr. 5, 2020, 9 pages.

Partial Search Report for application No. PCT/US2019/028625 dated Jul. 31, 2019.

Matejka et al., "Dream Lens: Exploration and Visualization of Large-Scale Generative Design Datasets", CHI 2018, Apr. 21-26, 2018, Apr. 21-26, 2018, pp. 1-12 pages.

Matejka et al., "Dream Lens: Exploration and Visualization of Large-Scale Generative Design Datasets", URL: https:www.youtube.comjwatch?v=gjsEhS8etlk, youtube video, Apr. 20, 2018, 4 pages.

Koyama et al., "Crowd-Powered Parameter Analysis for Visual Design Exploration", User Interface Software and Technology ACM, Oct. 5-8, 2014, pp. 65-74.

Zaman et al., "GEM-NI: A System for Creating and Managing Alternatives in Generative Design", CHI 2015, May 18, 2015, pp. 1201-1210.

Bronstein et al., "Scale-invariant heat kernel signatures for non-rigid shape recognition", 2010 IEEE Conference on Computer Vision and Pattern Recognition, 2010, pp. 1704-1711.

Cao et al., "Exploiting depth from single monocular images for object detection and semantic segmentation", Appearing in IEEE Transactions on Image Processing, Oct. 2016, arXiv:1610.01706 [cs.CV], 14 pages.

Chang et al., "Shapenet: An information-rich 3d model repository", 2015, arXiv:1512.03012 [cs.GR], https://arxiv.org/abs/1512.03012, 11 pages.

Cimpoi et al., "Describing textures in the wild", Nov. 15, 2013, arXiv:1311.3618 [cs.CV], https://arxiv.org/abs/1311.3618, 13 pages.

Donahue et al., "Decaf: A deep convolutional activation feature for generic visual recognition", Oct. 6, 2013, arXiv:1310.1531 [cs.CV], https://arxiv.org/abs/1310.1531, 10 pages.

Dumoulin et al., "A guide to convolution arithmetic for deep learning", Jan. 11, 2018, arXiv:1603.07285 [stat.ML], https://arxiv.org/abs/1603.07285, 31 pages.

Kazhdan et al., "Rotation invariant spherical harmonic representation of 3d shape descriptors", Eurographics Symposium on Geometry Processing 2003, 9 pages.

Krizhevsky et al., Imagenet classification with deep convolutional neural networks, Advances in Neural Information Processing Systems 25 (NIPS 2012), 2012, https://papers.nips.cc/paper/4824-imagenet-classification-with-deep-convolutional-neural-networ, 9 pages.

Osada et al., Shape distributions, ACM Transactions on Graphics, vol. 21, No. 4, Oct. 2002, pp. 807-832.

Qi et al., "Pointnet: Deep learning on point sets for 3d classification and segmentation", Apr. 10, 2017, arXiv:1612.00593 [cs.CV], https://arxiv.org/abs/1612.00593, 19 pages.

Qi et al., "Pointnet++: Deep hierarchical feature learning on point sets in a metric space", 31st Conference on Neural Information Processing Systems (NIPS 2017), 10 pages.

Shamai et al., "Geodesic distance descriptors", Proceedings of the IEEE Conference on Computer Vision and Pattern Recognition, 2017, pp. 6410-6418.

Su et al., Multi-view convolutional neural networks for 3d shape recognition, Proceedings of the IEEE international conference on computer vision, 2015, pp. 945-953.

Wu et al., "3d shapenets: A deep representation for volumetric shapes", Proceedings of the IEEE conference on computer vision and pattern recognition, 2015, 9 pages.

Zhou et al., "Thingi10k: A dataset of 10,000 3d-printing models", Jul. 2, 2016, arXiv:1605.04797 [cs.GR], https://arxiv.org/abs/1605.04797, 8 pages.

Alhashim et al., "Topology-varying 3D Shape Creation via Structural Blending", ACM Transactions on Graphics, vol. 33, No. 4, Article 158, Jul. 2014, http://doi.org/10.1145/2601097.2601102, 10 pages.

Allaire et al., "Structural optimization using sensitivity analysis and a level-set method", Journal of computational physics vol. 194, 1, 2004, pp. 363-393.

Ashour et al., "Optimizing Creatively in Multi-objective Optimization", Proceedings of the Symposium on Simulation for Architecture & Urban Design (SimAUD '15), Society for Computer Simulation International, 2015, Retrieved Mar. 24, 2017 from http://dl.acm.org/citation.cfm?id=2873021.2873039, 2015, pp. 128-135.

Attar et al., Embedded Rationality: A Unified Simulation Framework for Interactive Form Finding. International Journal of Architectural Computing, http://doi.org/10.1260/1478-0771.8.4.399, 2010, vol. 8, issue 4, pp. 399-418.

Averkiou et al., 2014. ShapeSynth: Parameterizing Model Collections for Coupled Shape Exploration and Synthesis, http://doi.org/10.1111/cgf.12310, Computer Graphics Forum vol. 33, No. 2, 2014, 125-134.

Ben-Yitzhak et al., "Beyond basic faceted search", Proceedings of the international conference on Web search and web data mining—WSDM '08, ACM Press, http://portal.acm.org/citation.cfm?doid=1341531.1341539, 2008, pp. 33-43.

Bradner et al., Parameters Tell the Design Story: Ideation and Abstraction in Design Optimization. Proceedings of the Symposium on Simulation for Architecture & Urban Design (SimAUD '14), Society for Computer Simulation International, http://dl.acm.org/citation.cfm?id=2664323.2664349, 2014, pp. 26:1-26:8.

Corne et al., "The Pareto Envelope-Based Selection Algorithm for Multiobjective Optimisation", Proceedings of the 6th International Conference on Parallel Problem Solving from Nature (PPSN VI), Springer-Verlag, Retrieved Apr. 4, 2017 from http://dl.acm.org/citation.cfm?id=645825.669102, 2000, pp. 839-848.

Denning et al., MeshGit: Diffing and Merging Meshes for Polygonal Modeling. ACM Transactions on Graphics, vol. 32, No. 4, Article 35, http://doi.org/10.1145/2461912.2461942, Jul. 2013, pp. 35:1-35:10.

Doboš et al., "3D Diff: An Interactive Approach to Mesh Differencing and Conflict Resolution", SIGGRAPH Asia 2012 Technical Briefs (SA '12), ACM, http://doi.org/10.1145/2407746.2407766, Nov. 28-Dec. 1, 2012, pp. 20:1-20:4.

Doraiswamy et al., Topology-based Catalogue Exploration Framework for Identifying View-enhanced Tower Designs", http://doi.

(56) References Cited

OTHER PUBLICATIONS org/10.1145/2816795.2818134", ACM Transactions on Graphics, vol. 34, No. 6, Article 230, Nov. 2015, pp. 230:1-230:13.

Hearst, M. Uls for Faceted Navigation: Recent Advances and Remaining Open Problems. International Journal of Machine Learning and Computing, http://ryenwhite.com/hcir2008/doc/HCIR08-Proceedings.pdf, 2008, pp. 337-343.

Jain et al., A., "Exploring Shape Variations by 3D-Model Decomposition and Part-based Recombination", Comput. Graph. Forum 31, 2pt3: 631-640. http://doi.org/10.1111/j.1467-8659.2012.03042. x, 2012, vol. 31, No. 2, pp. 631-640.

Kalogerakis et al., "A Probabilistic Model for Component-based Shape Synthesis", ACM Transactions on Graphics, vol. 31, No. 4, Article 55, Jul. 2012, http://doi.org/101145/2185520.2185551, pp. 55:1-55:11.

Kim et al., "InterAxis: Steering Scatterplot Axes via Observation-Level Interaction", IEEE Transactions on Visualization and Computer Graphics, http://doi.org/10.1109/TVCG.2015.2467615, vol. 22, No. 1, Jan. 2016, pp. 131-140.

Koren et al., "Personalized Interactive Faceted Search", Proceedings of the 17th International Conference on World Wide Web (WWW'08), ACM, http://doi.org/10.1145/1367497.1367562, Apr. 21-25, 2008, pp. 477-186.

Koyama et al., "Crowd-powered Parameter Analysis for Visual Design Exploration", Proceedings of the 27th Annual ACM Symposium on User Interface Software and Technology http://doi.org/10.1145/2642918.2647386, UIST'14, Oct. 5-8, 2014, pp. 65-74.

Lee et al., 2009. "FacetLens: Exposing Trends and Relationships to Support Sensemaking Within Faceted Datasets", Proceedings of the SIGCHI Conference on Human Factors in Computing Systems (CHI '09), ACM, http://doi.org/10.1145/1518701.1518896, Apr. 8, 2009, pp. 1293-1302.

Lienhard et al., "Thumbnail Galleries for Procedural Models", Comput. Graph. Forum 33, 2: 361-370.http://doi.org/10.1111/cgf.12317, vol. 33, No. 2, 2014, pp. 361-370.

Marks et al., "Design Galleries: A General Approach to Setting Parameters for Computer Graphics and Animation", Proceedings of the 24th Annual Conference on Computer Graphics and Interactive Techniques (SIGGRAPH '97), ACM Press/Addison-Wesley Publishing Co., http://doi.org/10.1145/258734.258887, pp. 389-400.

Matejka et al., "Video lens: rapid playback and exploration of large video collections and associated metadata", Proceedings of the 27th annual ACM symposium on User interface software and technology, ACM, UIST'14, Oct. 5-8, 2014, pp. 541-550.

Nagy et al., "Project Discover: An Application of Generative Design for Architectural Space Planning", 2017, https://www.autodeskresearch.com/publications/project-discover-application-generative-design-architectural-space-planning, 8 pages.

Porter et al., "Compositing Digital Images. Proceedings of the 11th Annual Conference on Computer Graphics and Interactive Techniques", (SIGGRAPH '84), ACM, 253-259.http://doi.org/10.1145/800031.808606, vol. 18, No. 3, Jul. 1984, pp. 253-259 pages.

Shea et al., "Towards integrated performance-driven generative design tools",Automation in Construction 14, 2, http://doi.org/10.1016/j.autcon.2004.07.002, 2005, pp. 253-264.

Stuart-Moore et al., "Interface Design for Browsing Faceted Metadata", Proceedings of the 6th ACM/IEEE-CS Joint Conference on Digital Libraries (JCDL '06), ACM, http://doi.org/10.1145/1141753.1141844, Jun. 11-15, 2006, pp. 349.

Teery et al., "Side Views: Persistent, On-demand Previews for Open-ended Tasks", Proceedings of the 15th Annual ACM Symposium on User Interface Software and Technology (UIST '02), ACM, http://doi.org/10.1145/571985.571996, UIST'02, Oct. 27-30, 2002, vol. 4, Issue 2, pp. 71-80.

Turrin et al., Design explorations of performance driven geometry in architectural design using parametric modeling and genetic algorithms. Advanced Engineering Informatics 25, 4: 656-675.http://doi.org/10.1016/j.aei.2011.07.009, 2011, pp. 656-675.

Ulu et al., "DMS2015-33: Generative interface structure design for supporting existing objects", Journal of Visual Languages & Computing, vol. 31, Part B: http://doi.org/10.1016/j jvlc.2015.10.016, 2015, pp. 171-183.

Vandic et al., "Facet Selection Algorithms for Web Product Search", Proceedings of the 22nd ACM International Conference on Conference on Information & Knowledge Management (CIKM '13), ACM, http://doi.org/10.1145/2505515.2505664, CIKM'13, Oct. 27-Nov. 1, 2013, pp. 2327-2332.

Voigt et al., "Weighted Faceted Browsing for Characteristics-based Visualization Selection Through End Users", Proceedings of the 4th ACM SIGCHI Symposium on Engineering Interactive Computing Systems (EICS'12), ACM, http://doi.org/10.1145/2305484.2305509, EICS'12, Jun. 25-26, 2012, pp. 151-156.

Wang et al., "A level set method for structural topology optimization", Computer methods in applied mechanics and engineering vol. 192, No. 1, 2003, 227-246.

Xu et al., "Fit and Diverse: Set Evolution for Inspiring 3D Shape Galleries", ACM Transactions on Graphics, vol. 31, No. 4, Article 57, http://doi.org/10.1145/2185520.2185553, Jul. 2012, pp. 57:1-57:10.

Yumer et al., "Procedural Modeling Using Autoencoder Networks", Proceedings of the 28th Annual ACM Symposium on User Interface Software & Technology http://doi.org/10.1145/2807442.2807448, (UIST '15), ACM, Nov. 8-11, 2015, pp. 109-118.

Zaman et al., "GEM-NI: A System for Creating and Managing Alternatives in Generative Design", Proceedings of the 33rd Annual ACM Conference on Human Factors in Computing Systems (CHI '15), ACM, http://doi.org/10.1145/2702123.2702398, pp. 1201-1210.

Generative Design at Airbus | Customer Stories | Autodesk, https://www.autodesk.com/customer-stories/airbus, Retrieved Apr. 5, 2020, 20 pages.

International Search Report for application No. PCT/US2019/028625 dated Nov. 7, 2019.

Ferringer, M P, "General framework for the reconfiguration of satellite constellations", URL:http://etda.libraries.psu.edu/theses/approved/WorldWideindex/ETD-3537/index.html, the whole document, 40 pages.

Godfrey et al., "Stabilizing Route Selection in BGP", IEEE/ACM Transactions on Networking, vol. 23 , No. 1, Feb. 2015, pp. 282-299.

Non Final Office Action received for U.S. Appl. No. 16/358,633 dated Jan. 25, 2022, 24 pages.

Final Office Action received for U.S. Appl. No. 16/358,633 dated Oct. 12, 2021, 28 pages.

Final Office Action received for U.S. Appl. No. 16/358,633 dated May 11, 2022, 24 pages.

Non-Final Office Action received for U.S. Appl. No. 16/358,633, dated May 13, 2021, 47 pages.

Advisory Action received for U.S. Appl. No. 16/358,633 dated Aug. 1, 2022, 8 pages.

Non Final Office Action received for U.S. Appl. No. 16/358,633 dated Sep. 21, 2022, 24 pages.

\* cited by examiner

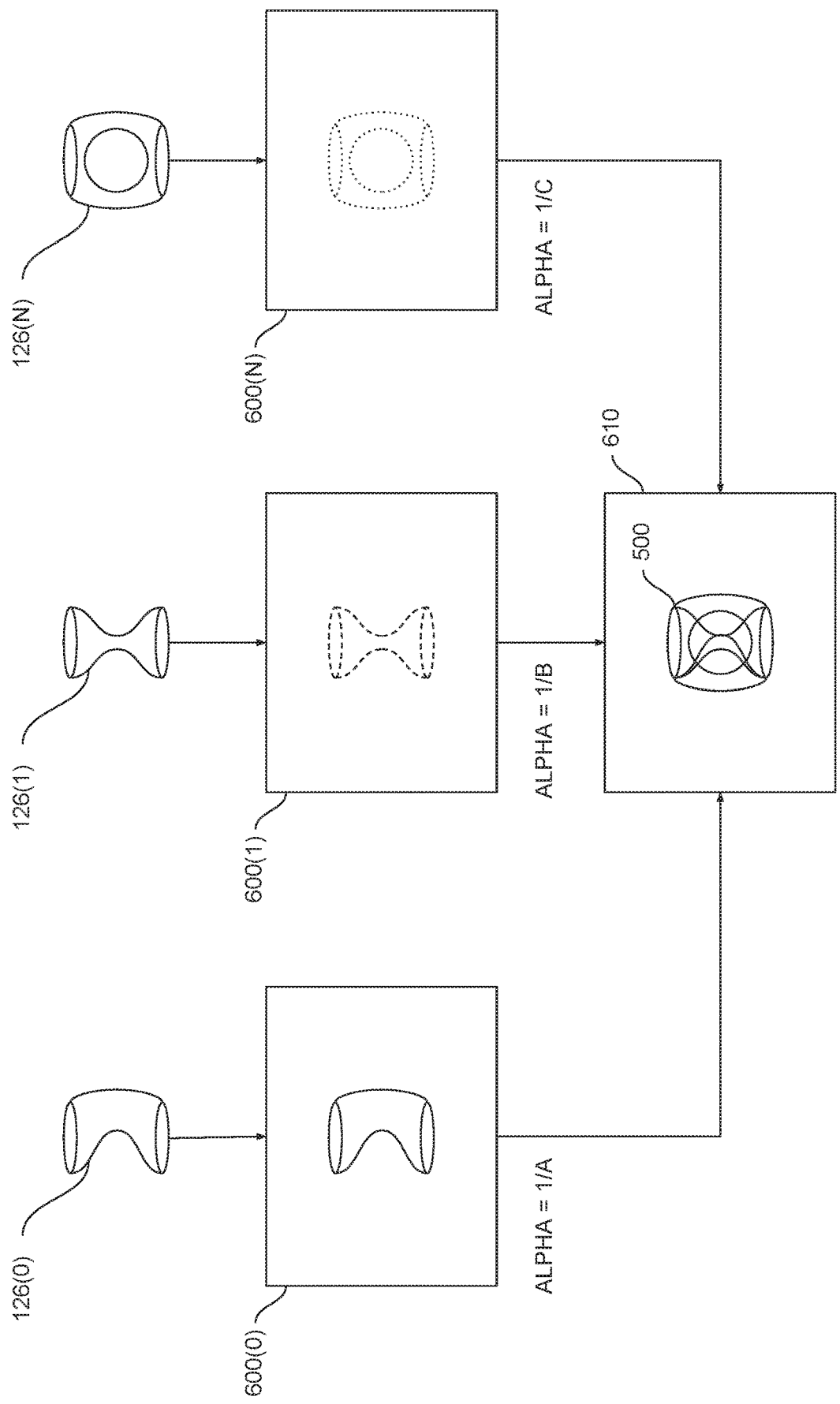

TECHNIQUES FOR VISUALIZING AND EXPLORING LARGE-SCALE GENERATIVE DESIGN DATASETS

CROSS-REFERENCE TO RELATED APPLICATIONS

This application claims the priority benefit of United States provisional patent application titled, "Techniques for Visualizing and Exploring Large-Scale Generative Design Datasets," filed on Apr. 23, 2018 and having Ser. No. 62/661,461. The subject matter of this related application is hereby incorporated herein by reference.

BACKGROUND

Field of the Various Embodiments

Embodiments of the present invention relate generally to computer-aided design technology and, more specifically, to techniques for visualizing and exploring large-scale generative design datasets.

Description Of the Related Art

In a generative design workflow, a designer analyzes an engineering problem and generates a problem definition that delineates various aspects of that engineering problem. In particular, the problem definition specifies different design criteria that should be met by any given design, including design constraints and design objectives. The designer inputs the problem definition to a generative design system, and the generative design system automatically generates numerous design options that meet the design criteria. The designer then reviews the different design options and identifies a subset of the design options that meet various engineering and/or aesthetic standards held by the designer.

One drawback of the above approach is that generative design systems can generate tens of thousands of design options for any given problem definition. Consequently, the designer is provided with an overwhelming amount of data to analyze. Designers typically address this problem by ignoring a large fraction of the generated design options. However, with such an approach, the designer can end up ignoring and not considering many "good" designs that would be found to meet the engineering and/or aesthetic standards if properly analyzed and considered by the designer.

Another drawback of the above approach is that different designers oftentimes have different opinions about whether or how well a given design option meets certain engineering and/or aesthetic standards. Such differences in opinion can reduce the effectiveness of having multiple designers work together to analyze the numerous design options typically generated when using a generative design system. Designers oftentimes address this problem by considering the subset of generated design options that meet only the engineering and/or aesthetic standards commonly held by all designers participating in the design process. However, given the vast number of design options to consider, such an approach also can result in many potentially "good" designs being ignored and not considered.

As the foregoing illustrates, what is needed in the art are more effective techniques for analyzing large-scale generative design datasets.

SUMMARY

Various embodiments include computer-implemented method for analyzing options, including generating a tradeoff space that includes a set of options that indicates tradeoffs associated with a decision, and generating a subset of options that resides along a first boundary within the tradeoff space, wherein at least one option in the subset of options is ranked higher than every other option in the set of options according to at least one of a first ranking of the set of options and a second ranking of the set of options.

At least one technological advantage of the disclosed application is that options are automatically analyzed relative to potentially competing characteristics to determine a subset of options that most effectively embodies those characteristics. Accordingly, the disclosed application allows participants with differing opinions regarding which options meet various standards to more effectively cooperate to select options.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

FIG. 6 illustrates how the graphical user interface (GUI) engine of FIG. 2 generates a composite image, according to various embodiments of the present invention;

DETAILED DESCRIPTION

Figure 1:
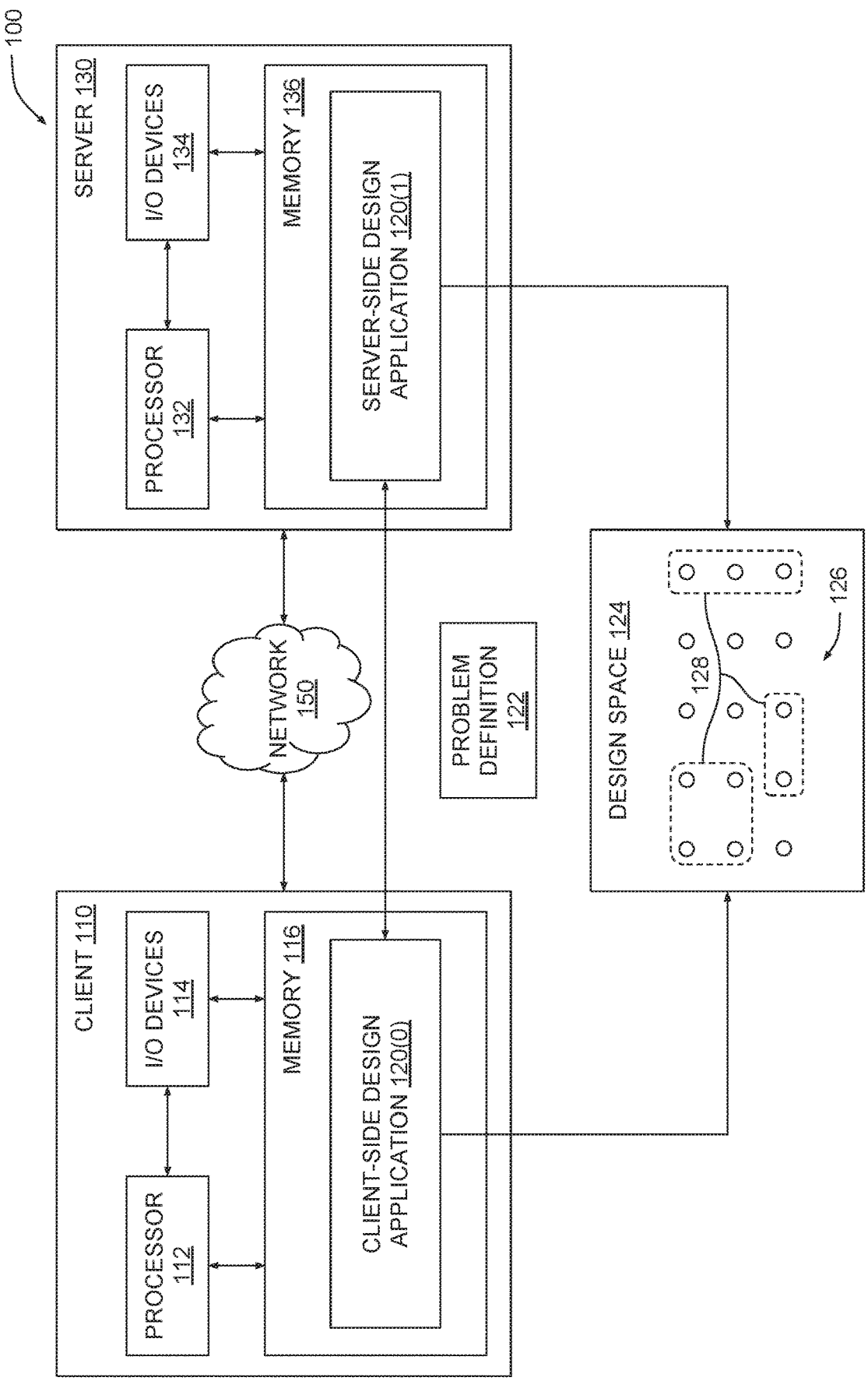
FIG. 1 illustrates a system configured to implement one or more aspects of the present invention.

In the following description, numerous specific details are set forth to provide a more thorough understanding of the various embodiments. However, it will be apparent to one skilled in the art that the inventive concepts may be practiced without one or more of these specific details.

As noted above, a designer can implement a generative design process to generate a design space that includes various design options that meet specific design criteria. The design space can include a vast number of design options, though. Consequently, the designer can have difficulty navigating the design space to identify a specific subset of design options that best comply with various functional and/or aesthetic principles held by the designer. These issues are further complicated when multiple designers having different opinions regarding desirable functional and/or aesthetic principles cooperate with one another to navigate the design space.

To address these issues, various embodiments includes a design application that is configured to visualize and explore large-scale generative design datasets. The design explorer includes a GUI engine that generates a design explorer, a composite explorer, and a tradeoff explorer. The design explorer displays a visualization of a multitude of design options included in a design space. The design explorer allows a user to filter the design space based on input parameters that influence a generative design process as well as various design characteristics associated with the different design options. The composite explorer displays a fully interactive composite of multiple different design options. The composite explorer exposes various tools that allow the user to filter the design space via interactions with the composite. The tradeoff explorer displays a tradeoff space based on different rankings of design options. The different rankings potentially correspond to competing design characteristics specified by different designers.

At least one technological advantage of the disclosed design application relative to the prior art is that large-scale datasets commonly associated with a generative design process can be more effectively explored to identify design options that best meet engineering and/or aesthetic standards. Accordingly, the disclosed design application relieves designers of painstakingly analyzing each and every design option in a vast collection of design options. Another technological advantage of the disclosed design application is that design options are automatically analyzed relative to potentially competing design characteristics to determine a subset of design options that most effectively embodies those design characteristics. Accordingly, the disclosed design application allows designers with differing opinions regarding which design options meet engineering and/or aesthetic standards to more effectively cooperate to select designs. The disclosed design application is therefore especially useful for processing large-scale datasets, such as those typically associated with generative design projects. For these reasons, the disclosed techniques represent a significant technological advancement compared to previous approaches.

System Overview

FIG. 1 illustrates a system configured to implement one or more aspects of the present invention. As shown, a system 100 includes one or more clients 110 and one or more servers 130 coupled together via a network 150. A given client 110 or a given server 130 may be any technically feasible type of computer system, including a desktop computer, a laptop computer, a mobile device, a virtualized instance of a computing device, a distributed and/or cloud-based computer system, and so forth. Network 150 may be any technically feasible set of interconnected communication links, including a local area network (LAN), wide area network (WAN), the World Wide Web, or the Internet, among others.

As further shown, a client 110 includes a processor 112, input/output (I/O) devices 114, and a memory 116, coupled together. Processor 112 includes any technically feasible set of hardware units configured to process data and execute software applications. For example, processor 112 could include one or more central processing units (CPUs). I/O devices 114 include any technically feasible set of devices configured to perform input and/or output operations, including, for example, a display device, a keyboard, and a touchscreen, among others.

Memory 116 includes any technically feasible storage media configured to store data and software applications, such as, for example, a hard disk, a random-access memory (RAM) module, and a read-only memory (ROM). Memory 116 includes client-side design application 120(0). Client-side design application 120(0) is a software application that, when executed by processor 112, causes processor 112 to interoperate with a corresponding client-side design application 120(1) that resides within server 130, as described in greater detail below.

Server 130 includes a processor 132, I/O devices 134, and a memory 136, coupled together. Processor 132 includes any technically feasible set of hardware units configured to process data and execute software applications, such as one or more CPUs. I/O devices 134 include any technically feasible set of devices configured to perform input and/or output operations, such as a display device, a keyboard, or a touchscreen, among others.

Memory 136 includes any technically feasible storage media configured to store data and software applications, such as, for example, a hard disk, a RAM module, and a ROM. Memory 136 includes server-side design application 120(1). Server-side design application 120(1) is a software application that, when executed by processor 132, causes processor 132 to interoperate with client-side design application 120(0), as mentioned above.

In operation, client-side design application 120(0) generates problem definition 122 based on input received from a user. Problem definition 122 specifies various design constraints, design objectives, and other design criteria associated with an engineering problem to be solved. Server-side design application 120(1) analyzes problem definition 122 and implements a generative design process to generate design space 124 based on problem definition 122. Design space 124 includes a multitude of design options 126. Each design option 126 meets the various design criteria set forth in problem definition 122. Client-side design application 120(0) performs various techniques to visualize and explore the multitude of design options 126 included in design space 124. Client-side design application 120(0) also performs various techniques to filter design options 126 to produce design selections 128. Design selections 128 meet various engineering and/or aesthetic standards associated with one or more users.

As a general matter, client-side design application 120(0) and server-side design application 120(1) collectively represent different portions of a distributed software entity. Thus, for simplicity, client-side design application 120(0) and server-side design application 120(1) will be collectively referred to herein as design application 120. Design application 120 is described in greater detail below in conjunction with FIG. 2.

Software Overview

Figure 2:
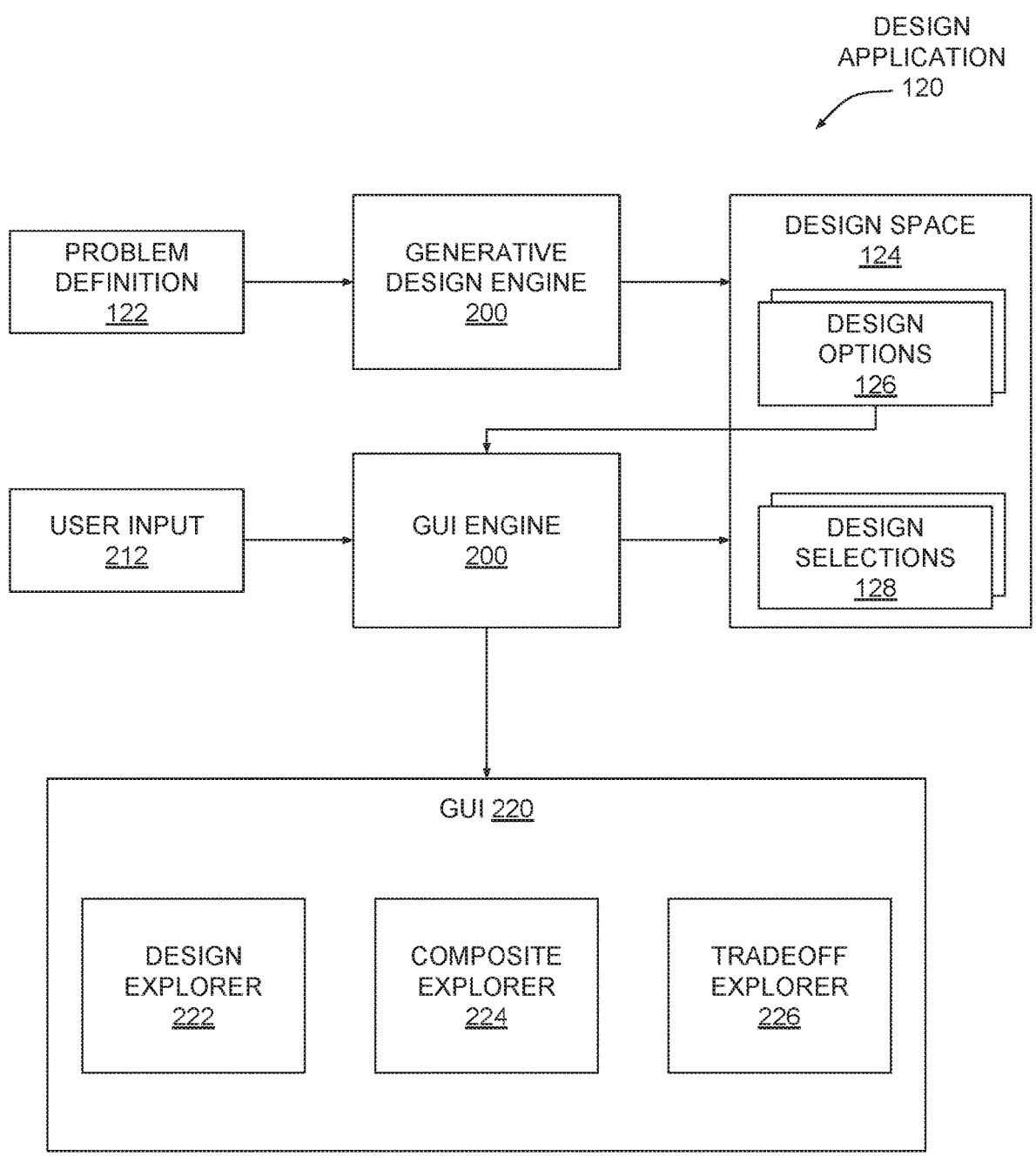
FIG. 2 is a more detailed illustration of the design application of FIG. 1, according to various embodiments of the present invention.

FIG. 2 is a more detailed illustration of the design application of FIG. 1, according to various embodiments of the present invention. As shown, design application 120 includes a generative design engine 200 and a GUI engine 210.

Generative design engine 200 processes problem definition 122 to generate design space 124. In particular, generative design engine 200 performs a generative design process based on problem definition 122 to generate each design option 126 included in design space 124. In one embodiment, generative design engine 200 may execute a multi-objective solver and/or a topology generation algorithm to generate design options 126. An example of problem definition 122 is described in greater detail below in conjunction with FIG. 3A. An example of design space 124 is described in greater detail below in conjunction with FIG. 3B.

GUI engine 210 generates a GUI 220 to represent some or all of design space 124. GUI engine 210 receives user input 212 and then filters design options 126 based on user input 212 to produce design selections 128. As such, design selections 128 is a subset of design options 126. GUI engine 210 includes various sub-modules with which the user can interact to cause GUI engine 210 to filter design options 126. Specifically, GUI 220 includes a design explorer 222, a composite explorer 224, and a tradeoff explorer 226. Design explorer 222 provides visualization tools that allow a user to efficiently explore design space 124. Design explorer 222 is described in greater detail below in conjunction with FIG. 4. Composite explorer 224 allows the user to interact with a composite model of multiple design options 126 to filter those design options and generate some or all of design selections 128. Composite explorer 224 is described in greater detail below in conjunction with FIGS. 5-8. Tradeoff explorer 226 includes utilities for sorting design options 126 based on input received from multiple users to produce one or more design selections 128. Tradeoff explorer 226 is described in greater detail below in conjunction with FIGS. 9-10.

Figure 3A:
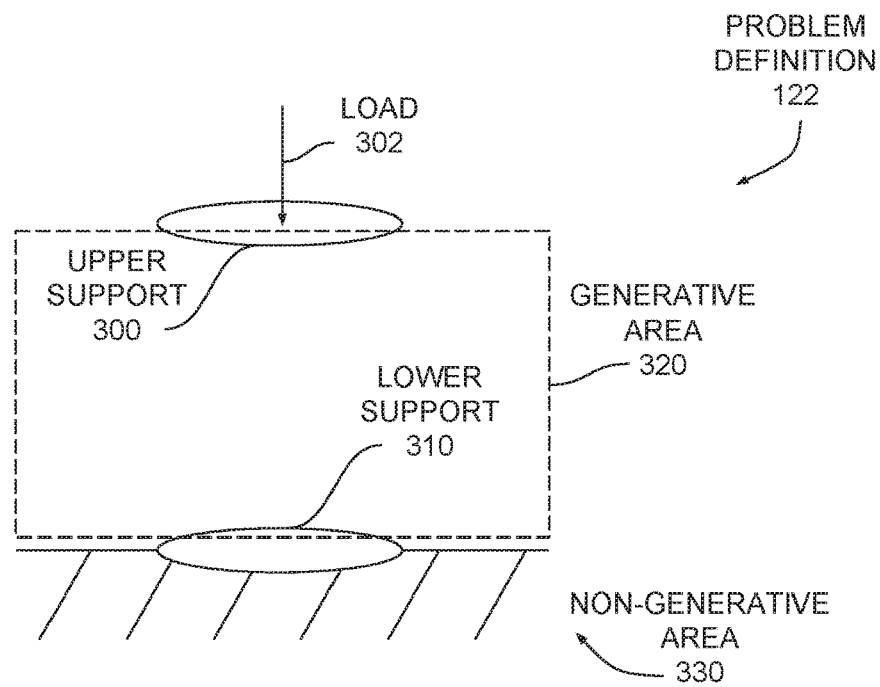
FIG. 3A sets forth an exemplary problem definition, according to various embodiments of the present invention.
Figure 3B:
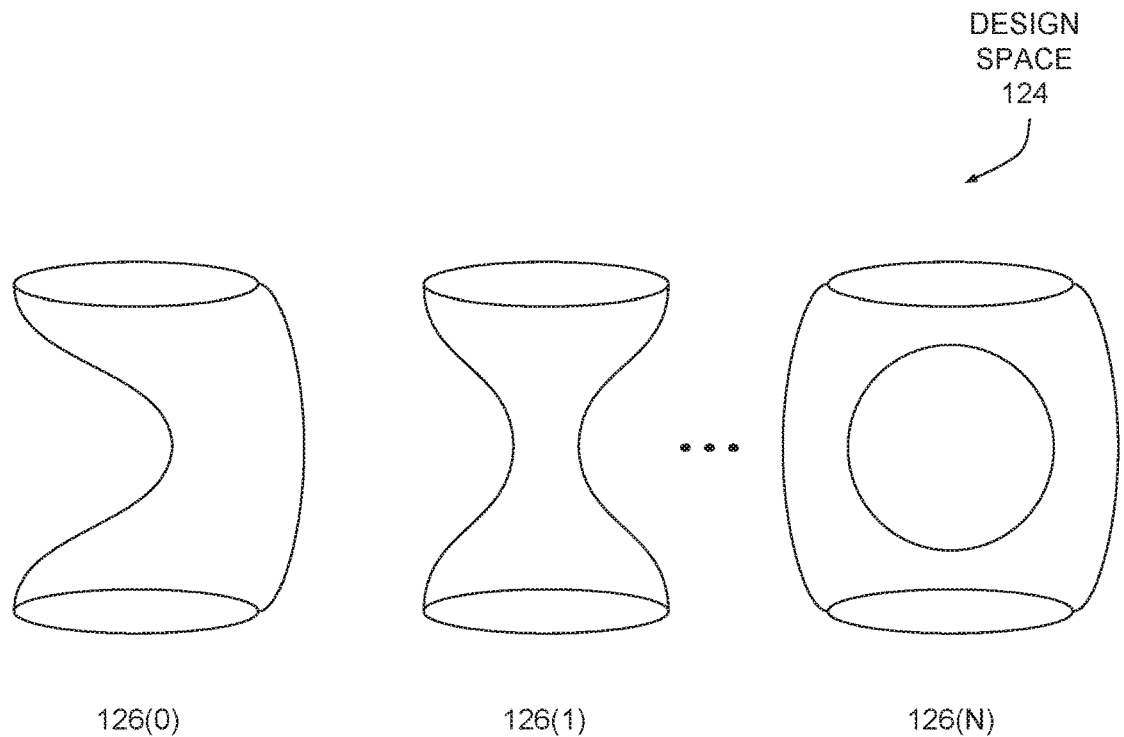
FIG. 3B sets forth an exemplary design space, according to various embodiments of the present invention.

As mentioned above, generative design engine 200 performs a generative design process based on problem definition 122 to generate design space 124 and design options 126 included therein. FIGS. 3A-3B set forth an exemplary problem definition 122 and corresponding design space 124 generated via the generative design process.

Exemplary Problem Definition and Corresponding Design Space

FIG. 3A sets forth an exemplary problem definition, according to various embodiments of the present invention. Problem definition 122 generally relates to an engineering problem to be solved. In the example shown, the engineering problem is the need for a structure that can support a particular load. The structure needs to be positioned between an upper support and a lower support and should have sufficient strength to support a specific load. Problem definition 122 captures these different design criteria in the manner shown.

More specifically, problem definition 122 includes an upper support 300 and a lower support 310, where a load 302 is applied to upper support 300. Problem definition 122 also includes a generative area 320 where a generative design process can occur and a non-generative area 330 where the generative design process cannot occur.

Based on problem definition 122, generative design engine 200 of FIG. 2 performs an iterative generative design process to procedurally generate design options 126 that address the engineering design problem mentioned above and meet the various design criteria set forth in problem definition 122. For example, generative design engine 200 could execute a multi-objective solver and/or a topology generation algorithm to produce a set of three-dimensional (3D) structures that couple together upper support 300 and lower support 310 within generative area 320 and have sufficient strength to support load 302. Generative design engine 200 performs the generative design process to generate and populate design space 124 with design options 126, as described in greater detail below in conjunction with FIG. 3B.

FIG. 3B sets forth an exemplary design space, according to various embodiments of the present invention. Design space 124 corresponds to the engineering problem mentioned above in conjunction with FIG. 3B and includes design options 126(0) through 126(N). Each design option 126 includes geometry that meets the design criteria set forth in problem definition 122 of FIG. 3A.

Generative design engine 200 may generate numerous design options 126 within design space 124. For example, generative design engine 200 could generate ten thousand design options 126 that all meet the design criteria set forth in problem definition 122. Some design options 126 may include similar geometry, such as design options 126(0) and 126(1), while other design options 126 may include dissimilar geometry, such as design options 126(1) and 126(N). As a general matter, design options 126 include any technically feasible geometrical structure, including regular structures as well as irregular structures.

In one embodiment, generative design engine 200 may generate different design options 126 by varying one or more input parameters to the generative design process. In another embodiment, generative design engine 200 may also generate design options 126 by varying one or more values set forth in problem definition 122, potentially increasing the number of design options 126 included in design space 124 by a significant margin.

Because design space 124 can include a great number of design options 126, and because those design options 126 can have a range of different types of geometry, the user generally cannot manually analyze each design option 126 one by one in any reasonable amount of time. In other words, design space 124 includes an overwhelming amount of data that cannot be processed by the user without neglecting to consider potentially viable design options 126. To address this issue, GUI engine 210 of FIG. 2 generates design explorer 222, composite explorer 224, and tradeoff explorer 226 within GUI 220 in order to provide the user with various tools for visualizing, exploring, and filtering design space 124, as described in greater detail below.

Design Explorer for Navigating a Design Space

Figure 4:
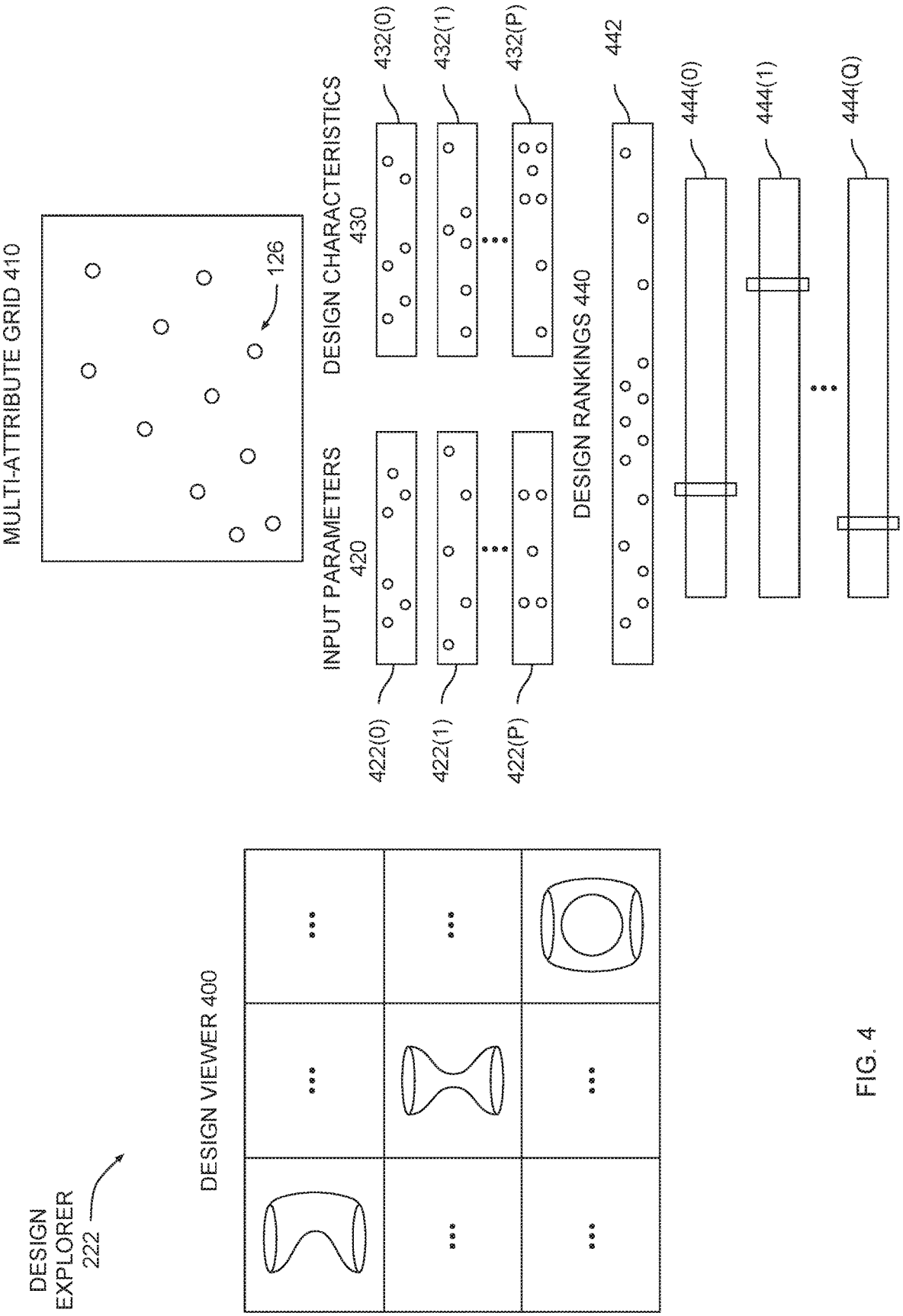
FIG. 4 is a more detailed illustration of the design explorer of FIG. 2, according to various embodiments of the present invention.

FIG. 4 is a more detailed illustration of the design explorer of FIG. 2, according to various embodiments of the present invention. As shown, design explorer 222 includes design viewer 400, multi-attribute grid 410, input parameters 420, design characteristics 430, and design rankings 440.

Design viewer 400 depicts various design options 126 included in design space 124. Design viewer 400 can also depict any subset of design options 126. Design options can be displayed as single points, thumbnail images, or interactive 3D models, among others representations. Multi-attribute grid 410 depicts an assortment of design options 126 that are positioned relative to a set of axes based on different sets of design characteristics.

Input parameters 420 include single-attribute controllers 422 that can be manipulated by the user to change the values of various input parameters. Each input parameter generally corresponds to an input to the generative design process discussed previously. For example, a given input parameter could be a specific value for load 302 of FIG. 3A. The user can manipulate a given single-attribute controller 422 in order to set a particular range of values for the corresponding input parameter. In response, GUI engine 210 updates design viewer 400 and/or multi-attribute grid 410 to filter out those design options 126 with input parameters falling outside of that range of value. In this manner, single-attribute controllers 422 allow the user to efficiently explore design space 124. Each single-attribute controller 422 also indicates a distribution of design options 126 representing different parameter values for different design options 126.

Design characteristics 430 includes single-attribute controllers 432 that can be manipulated by the user to change the values of various design characteristics. Each design characteristics generally corresponds to an emergent property associated with design options 126. For example, a given design characteristic could be a weight value for a corresponding design option 126. Similar to single-attribute controllers 422 discussed above, the user can manipulate a given single-attribute controller 432 in order to set a particular range of values for the corresponding design characteristic. In response, GUI engine 210 updates design viewer 400 and/or multi-attribute grid 410 to filter out those design options 126 with design characteristics falling outside of that range of values. In this fashion, single-attribute controllers 432 allow the user to efficiently explore design space 124. Each single-attribute controller 432 also indicates a distribution of design options 126 representing different design characteristic values for different design options 126.

Design rankings 440 includes one or more rankings 442 along with a set of ranking controls 444. Each ranking control 444 can be manipulated by the user to adjust a weight value that is applied to a corresponding design option attribute. A given design option attribute may be an input parameter or a design characteristic. Based on the settings applied to ranking controls 444, GUI engine 210 ranks design options 126 within ranking 442. Ranking 442 indicates a distribution of design options 126 that are ordered based on the weight values set forth in ranking controls 444.

Based on interactions with the user, GUI engine 210 progressively filters design space 124 to suppress display of design options 126 that do not meet various selection criteria. The user can specify the various selection criteria via the different GUI controls discussed above. As design options 126 are filtered out that do not meet the selection criteria, design viewer 400 displays fewer and fewer design options 126. Design viewer 400 also displays more detailed versions of the remaining design options 126. The user can also interact with a composite version of multiple design options 126 via interactions with composite explorer 224, as described in greater detail below in conjunction with FIGS. 5-8.

Composite Explorer for Filtering a Design Space

Figure 5:
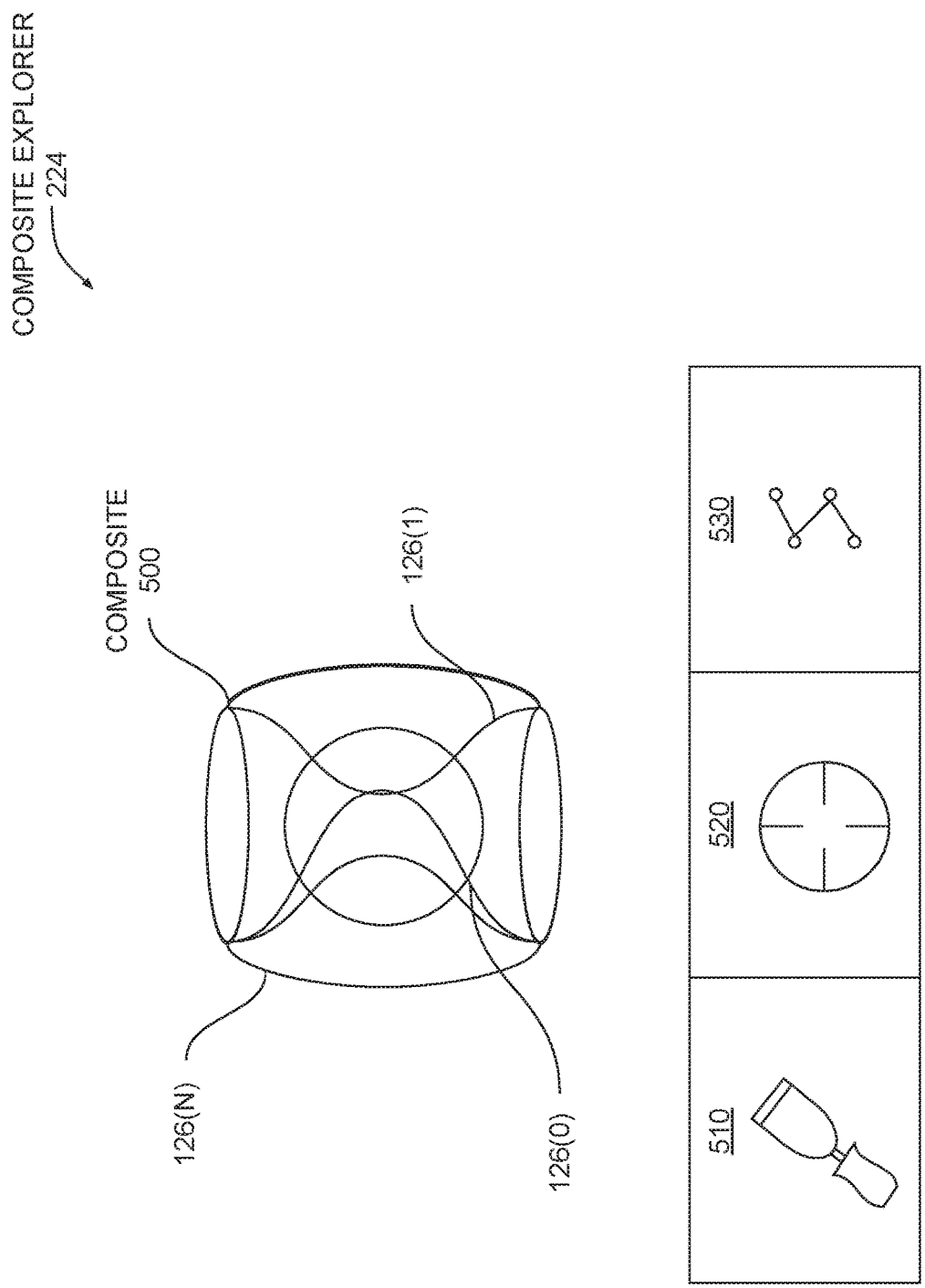
FIG. 5 is a more detailed illustration of the composite explorer of FIG. 2, according to various embodiments of the present invention.

FIG. 5 is a more detailed illustration of the composite explorer of FIG. 2, according to various embodiments of the present invention. As shown, composite explorer 224 includes a composite 500 that, in the example shown, is generated based on design options 126(0), 126(1), and 126(N) of FIG. 3B.

GUI engine 210 generates composite 500 to display various contours associated with multiple design options 126 in conjunction with one another. With this approach, design options 126 having similar or dissimilar features can more easily be compared with one another. GUI engine 210 exposes a set of tools within composite explorer 224 that allows the user to filter design space 124 based on interactions with composite 500. In particular, composite explorer 224 includes a chisel tool 510, a select tool 520, and an edge tool 530. These different tools are described in greater detail below in conjunction with FIGS. 7A, 7B, and 7C, respectively.

GUI engine 210 can generate composite 500 using several different techniques. In practice, GUI engine 210 renders a set of images based on 3D models associated with different design options 126, and then composites the set of images together with varying alpha values, as described in greater detail below in conjunction with FIG. 6.

FIG. 6 illustrates how the GUI engine of FIG. 2 generates a composite image, according to various embodiments of the present invention. As shown, GUI engine 210 performs a rendering operation with each design option 126 to generate a different image 600. Each image 600 is a two-dimensional (2D) rendering of a 3D model associated with a given design option 126. GUI engine 210 computes a different alpha value for each image 600. A given alpha value can have any value between zero and one. In the example shown, the alpha values for images 600(0), 600(1), and 600(N) are A, B, and C. GUI engine 210 performs an alpha blending process with images 600 based on the associated alpha values to generate composite 500.

In one embodiment, GUI engine 210 may perform the above-described alpha blending process sequentially for a sequence of images 600. In doing so, GUI engine 210 may assign an alpha value to each image 600 that depends on the position of the image 600 in the sequence. For a given image 600 having a position number $P_n$, GUI engine 210 may assign an alpha value of $1/P_n$ to the image 600. For example, GUI engine 210 could assign alpha values of 1, ½, and ⅓ to images 600(0), 600(1), and 600(N), respectively.

Referring generally to FIGS. 5-6, the compositing approach described above is computationally efficient and therefore allows GUI engine 210 to update composite 500 in real time based on user input. For example, GUI engine 210 could receive user input indicating that composite 500 should be rotated in 3D. In response, GUI engine 210 could rotate the 3D models associated with each underlying design option 126, render a set of images that represent the rotated version of those 3D models, and then composite the images together to produce an updated version of composite 500. GUI engine 210 can perform these steps quickly enough to allow smooth rotation of composite 500 to be displayed to the user.

In one embodiment, GUI engine 210 may generate composite 500 by combining a set of 3D models associated with multiple design options 126 and then rendering a single image based on those combined models. GUI engine 210 may also generate rotated versions of composite 500 in response to user input by applying rotation operations to the combined models and rendering another image. In another embodiment, GUI engine 210 may generate composite 500 by performing the alpha blending approach described in conjunction with FIG. 6 with a set of pre-rendered images.

As mentioned, design explorer 224 exposes a set of tools that allows the user to interact with composite 500 to filter out design options 126 that do not meet certain selection criteria set forth by the user. These tools are described in greater detail below in conjunction with FIGS. 7A-7B.

Figure 7A:
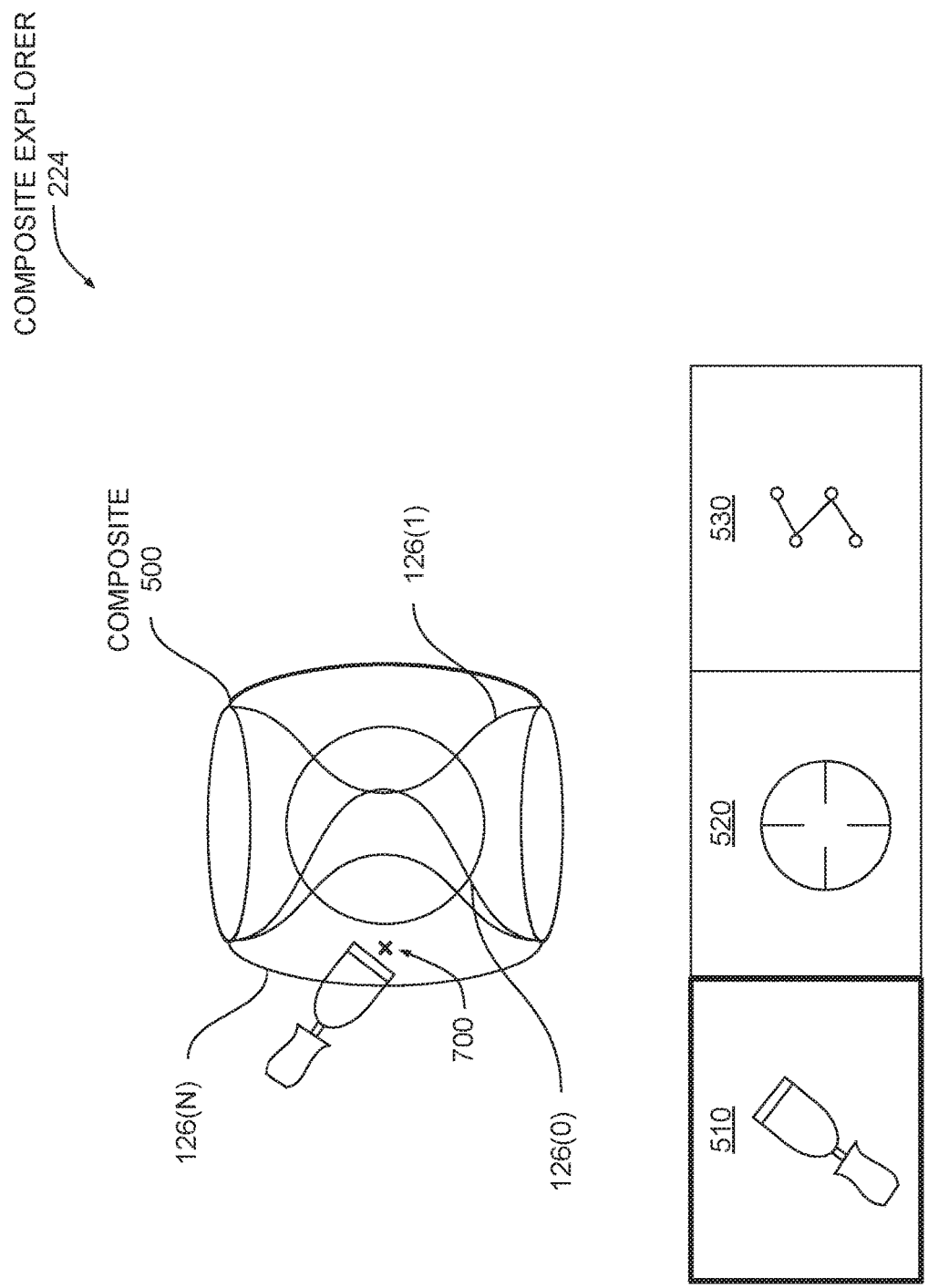
FIG. 7A illustrates how the GUI engine of FIG. 2 filters a design space via a chisel tool, according to various embodiments of the present invention.

FIG. 7A illustrates how the GUI engine of FIG. 2 filters a design space via a chisel tool, according to various embodiments of the present invention. As shown, using chisel tool 510, the user indicates a position 700 on composite 500. Based on position 700, GUI engine 210 performs a hit test with each underlying 3D model to determine that position 700 intersects design option 126(N) but does not intersect design options 126(0) and 126(1). In response, GUI engine 210 filters out design option 126(N) and regenerates composite 500 to not include any images derived from design option 126(N). In this manner, chisel tool 510 allows the user to select specific regions where design options 126 should not include any material and to eliminate any design options 126 that include material in those specific regions.

Figure 7B:
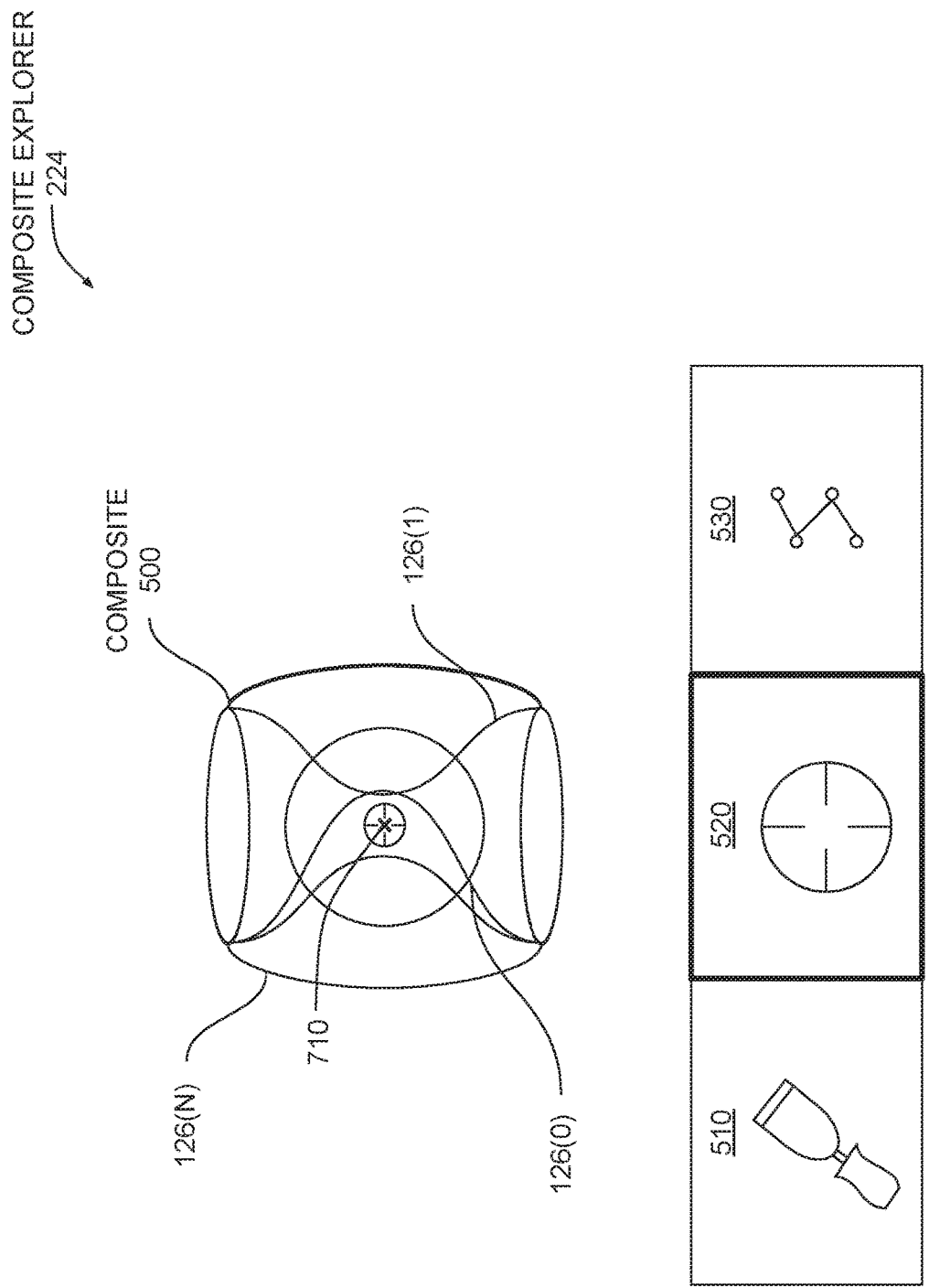
FIG. 7B illustrates how the GUI engine of FIG. 2 filters a design space via a select tool, according to various embodiments of the present invention.

FIG. 7B illustrates how the GUI engine of FIG. 2 filters a design space via a select tool, according to various embodiments of the present invention. As shown, using select tool 520, the user indicates a position 710 on composite 500. Based on position 710, GUI engine 210 performs a hit test with each underlying 3D model to determine that position 710 intersects design options 126(0) and 126(1) but does not intersect design option 126(N). In response, GUI engine 210 filters out design option 126(N) and regenerates composite 500 to not include any images derived from design option 126(N). With this technique, select tool 520 allows the user to select specific regions where design options 126 should include material and to eliminate any design options 126 that do not include material in those specific regions.

Figure 7C:
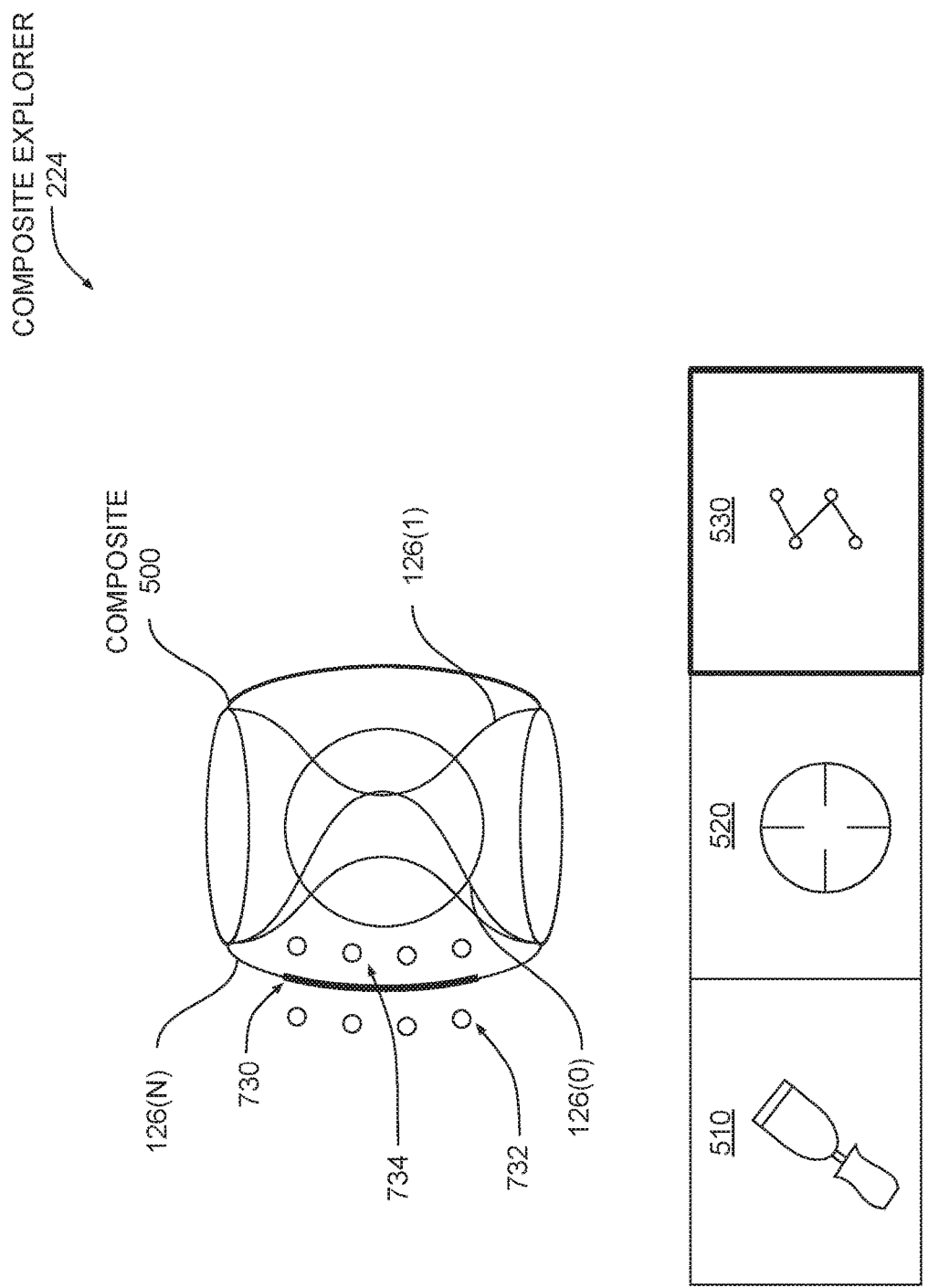
FIG. 7C illustrates how the GUI engine of FIG. 2 filters a design space via an edge tool, according to various embodiments of the present invention.

FIG. 7C illustrates how the GUI engine of FIG. 2 filters a design space via an edge tool, according to various embodiments of the present invention. As shown, using edge tool 530, the user traces an arc 730 across a portion of composite 500. GUI engine 210 analyzes arc 730 and then generates adjacent points 732 and adjacent points 734. Adjacent points 732 and 734 reside on opposite sides of arc 730. GUI engine 730 performs a hit test with the 3D model associated with each underlying design option 126 to determine whether any of adjacent points 732 and 734 intersect that 3D model.

In situations where each adjacent point 732 intersects a given 3D model and each adjacent point 734 does not intersect the given 3D model, GUI engine 210 determines that arc 730 resides along an edge of the given 3D model. GUI engine 210 then filters design options 126 to eliminate any design options 126 lacking an edge that is aligned with arc 730. In the example shown, GUI engine 210 determines that arc 730 resides along an edge of design option 126(N) but does not reside along any edges of design options 126(0) and 126(1). Accordingly, GUI engine 210 suppresses design options 126(0) and 126(1) and regenerates composite 500 to not include any images derived from design options 126(0) and 126(1). In this manner, edge tool 530 allows the user to indicate specific geometrical features that design options 126 should have and to eliminate any design options 126 that lack these particular geometrical features. The various techniques described above are described in greater detail below in conjunction with FIG. 8.

Figure 8:
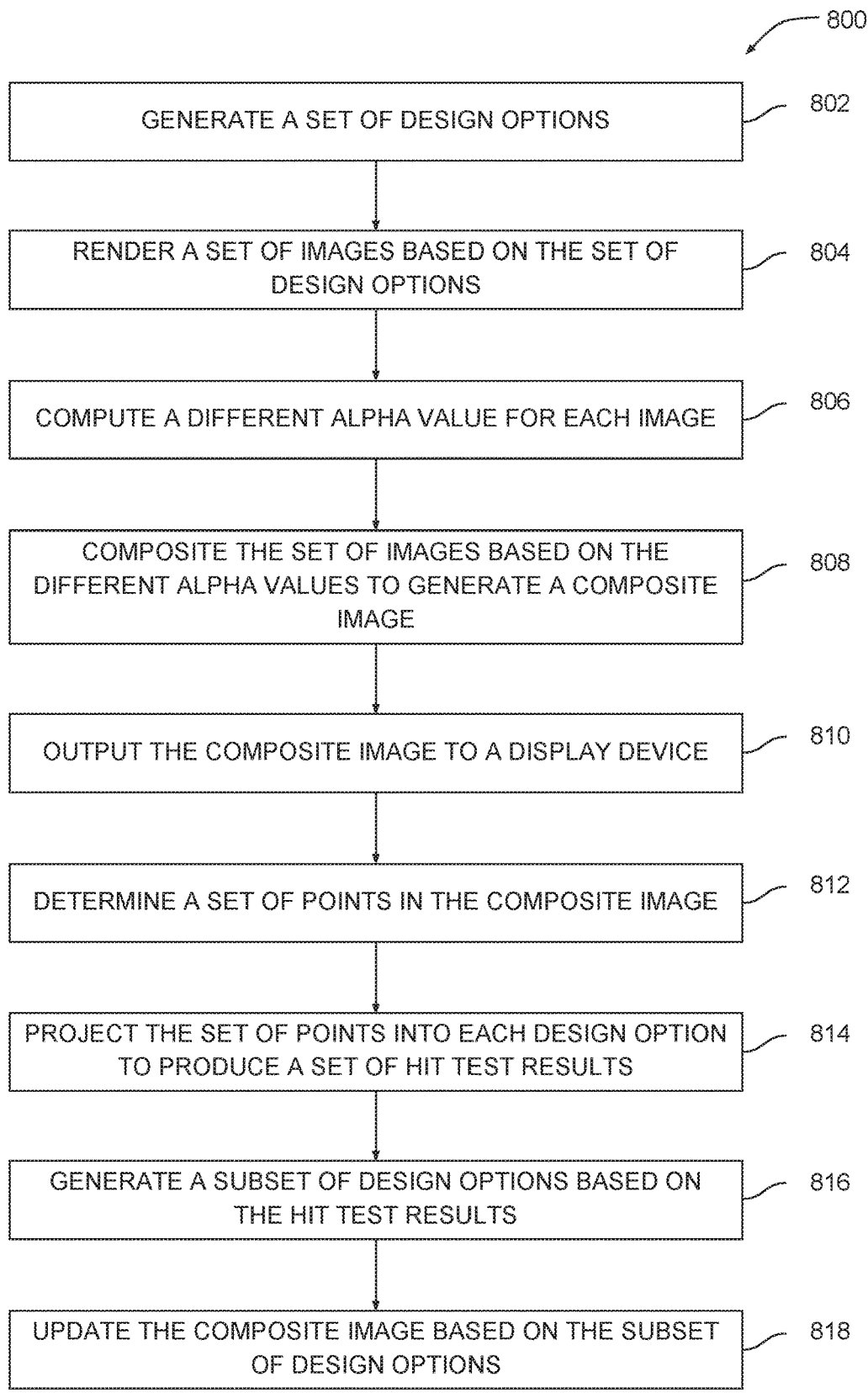
FIG. 8 is a flow diagram of method steps for generating a composite image that represents a portion of a design space, according to various embodiments of the present invention.

FIG. 8 is a flow diagram of method steps for generating a composite image that represents a portion of a design space, according to various embodiments of the present invention. Although the method steps are described in conjunction with the systems of FIGS. 1-7C, persons skilled in the art will understand that any system configured to perform the method steps in any order falls within the scope of the present invention.

As shown, a method 800 begins at step 802, where generative design engine 200 of FIG. 2 generates a set of design options. Generative design engine 200 analyzes problem definition 122 and then generates design space 124 to include design options 126. In doing so, generative design engine 200 performs a generative design process. In one embodiment, generative design engine 200 may execute a multi-objective solver and/or a topology generation algorithm to generate design options 126.

At step 804, GUI engine 210 of FIG. 2 renders a set of images based on the set of design options. Each image is a 2D rendering of a 3D model associated with a given design option 126. In one embodiment, GUI engine 210 may pre-render the set of images after generative design engine 200 initially generates design options 126.

At step 806, GUI engine 210 computes a different alpha value for each image. A given alpha value can have any value between zero and one. In one embodiment, GUI engine 210 may generate a different alpha value for each image that depends on the position of the image in a sequence. For a given image having a position number $P_n$ in the sequence, GUI engine 210 may assign an alpha value of $1/P_n$ to the image. This approach may allow each image to contribute an equal amount of pixel values during subsequent alpha blending.

At step 808, GUI engine 210 composites the set of images based on the different alpha values to generate a composite image. GUI engine 210 performs an alpha blending process using the alpha values generated at step 806. GUI engine 210 may composite the set of images sequentially using the technique described in conjunction with step 806.

At step 810, GUI engine 210 outputs the composite image to a display device. GUI engine 210 can perform steps 804, 806, 808, and 810 in a computationally efficient manner and therefore can generate and/or update the composite in real time based on user input. For example, GUI engine 210 could perform these steps to generate a rotated version of the composite based on a rotation command received from the user.

At step 812, GUI engine 210 determines a set of points in the composite image. GUI engine 210 can determine the set of points based on user interactions with any of chisel tool 510, select tool 520, and edge tool 530. The set of points could correspond to, for example, any of positions 700 and 710 shown in FIGS. 7A and 7B, respectively, or arc 730 shown in FIG. 7C.

At step 814, GUI engine 210 projects the set of points into each design option to produce a set of hit results. In particular, GUI engine 210 performs a hit test with the set of points and the different 3D models associated with each design option 126. GUI engine 210 then generates hit test results indicating which points in the set of points intersect which 3D models.

At step 816, GUI engine 210 generates a subset of design options based on the hit results. Depending the particular tool with which the set of points is determined, GUI engine 210 performs different operations. If the set of points is determined using chisel tool 510, then GUI engine 210 suppresses any design options 126 having 3D models that intersect the set of points, as described above in conjunction with FIG. 7A. If the set of points is determined using select tool 520, then GUI engine 210 suppresses any design options 126 having 3D models that do not intersect the set of points, as described above in conjunction with FIG. 7B. If the set of points is determined using edge tool 510, then GUI engine 210 suppresses any design options 126 having 3D models lacking an edge corresponding to those points, as described above in conjunction with FIG. 7C.

At step 818, GUI engine 210 updates the composite image based on the subset of design options. GUI engine 210 generates design selections 128 to reflect the subset of design options 126 generated via step 816 and then updates the composite to only include images derived from the remaining 3D models. GUI engine 210 can re-render images based on the remaining 3D models or simply recompute the alpha values for the corresponding images and repeat the alpha blending process.

Referring generally to FIG. 5-8, one advantage of the techniques described thus far is that GUI engine 210 can efficiently filter design space 124 based on user input in order to reduce the number of design options 126 that need to be visually analyzed by the user. Accordingly, the user can explore design space 124 far more efficiently than possible with conventional techniques.

GUI engine 210 also performs additional techniques to analyze tradeoffs between different rankings of design options 126 associated with different users, as described in greater detail below in conjunction with FIGS. 9-10.

Tradeoff Explorer for Constraining a Design Space

Figure 9:
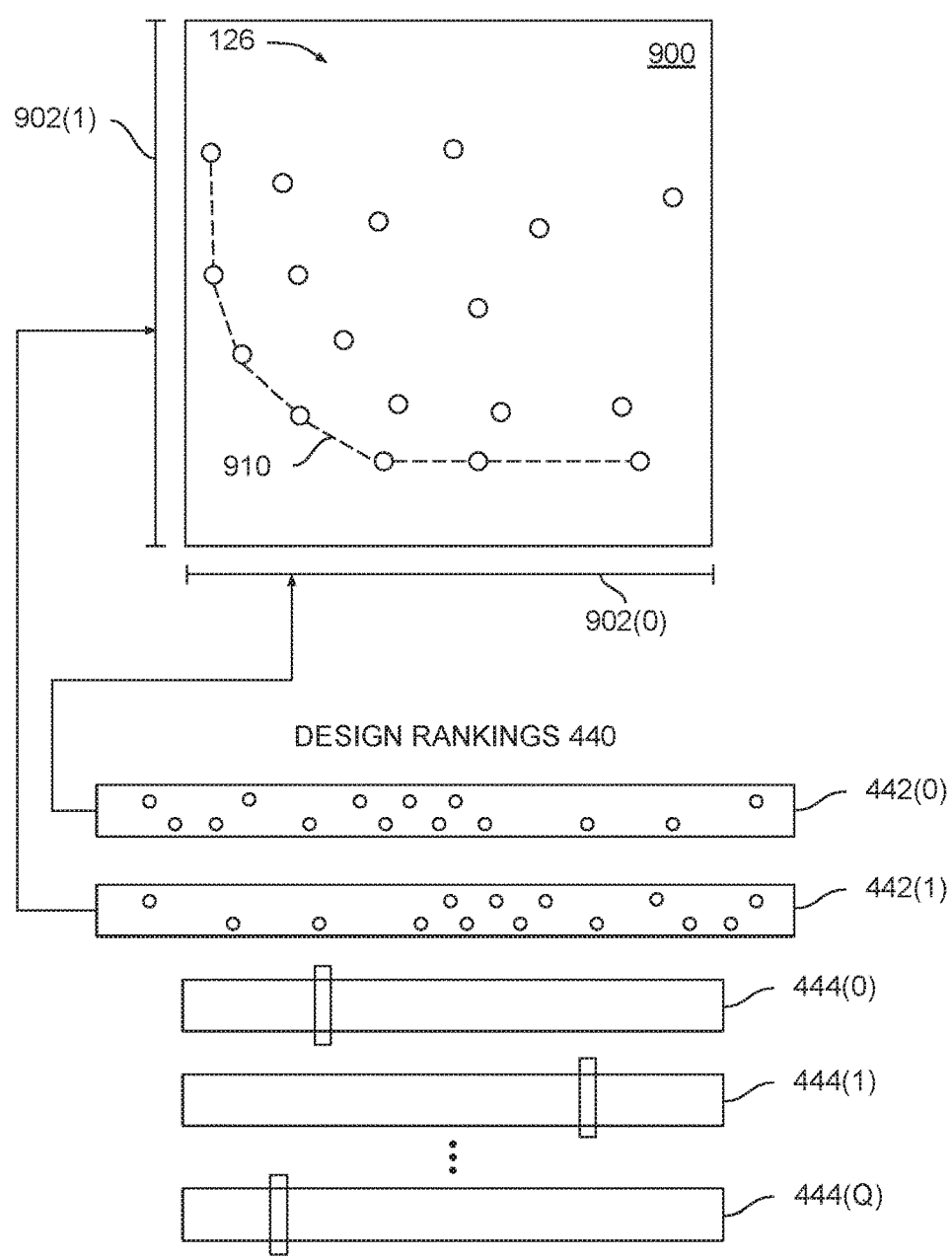
FIG. 9 is a more detailed illustration of the tradeoff explorer of FIG. 2, according to various embodiments of the present invention.

FIG. 9 is a more detailed illustration of the tradeoff explorer of FIG. 2, according to various embodiments of the present invention. As shown, tradeoff explorer 226 includes a tradeoff space 900 that includes ranking axes 902(0) and 902(1). Tradeoff space 900 includes design options 126 plotted against ranking axes 902. Tradeoff explorer 226 further includes design rankings 440 of FIG. 4. Design rankings 440 include rankings 442(0) and 442(1) and ranking controls 444. In operation, tradeoff explorer 226 receives input from multiple users indicating different rankings of design options 126. GUI engine 210 processes the different rankings and then populates tradeoff space 900 with design options 126 organized according to those rankings. In doing so, GUI engine 210 configures each ranking axis 902 based on a different ranking 442 and then positions each design option 126 relative to those ranking axes.

In the example shown, GUI engine 210 receives input from two users and then generates rankings 442(0) and 442(1) based on that input. GUI engine 210 then populates tradeoff space 900 with design options 126 according to rankings 442(0) and 442(1). In particular, GUI engine 210 configures ranking axis 902(0) based on ranking 442(0) and configures ranking axis 902(1) based on ranking 442(1). For a given design option 126, GUI engine 210 then determines a set of coordinates with which to position the given design option 126 within tradeoff space 900. GUI engine 210 determines the set of coordinates based on where the given design option 126 is ranked within rankings 442(0) and 442(1). For example, suppose a given design option 126 is ranked $32^{nd}$ within ranking 442(0) and $16^{th}$ within ranking 442(1). GUI engine 210 could then position the given design option 126 relative to ranking axes 902(0) and 902(1) with an (X, Y) coordinate of (32, 16).

Via the approach described above, GUI engine 210 generates tradeoff space 900 to visually depict how well different design rankings 126 satisfy two or more rankings. Those rankings 126 can be generated by different users who have differing opinions about which design options 126 most effectively meet various engineering and/or aesthetic standards. Accordingly, the positioning of design options 126 within tradeoff space 900 reflects tradeoffs between the different design options 126 relative to those different rankings. For example, design options 126 that reside in the upper-left quadrant of tradeoff space 900 may be ranked higher according to ranking 442(0) but ranked lower according to ranking 442(1). Conversely, design options 126 that reside in the lower-right quadrant of tradeoff space 900 may be ranked lower according to ranking 442(0) but ranked higher according to ranking 442(1).

In one embodiment, GUI engine 210 generates rankings 442 automatically based on user input. The user input reflects sample design options 126 that should have higher rankings. GUI engine 210 analyzes one or more highly-ranked sample design options 126 indicated in the user input and then ranks other design options 126 based on how similar those design options 126 are to the highly-ranked design options 126. GUI engine 210 can determine similarity between design options 126 based on design characteristics 430 associated with those design options 126, among other approaches. GUI engine can perform the above technique with sample design options 126 that should have lower rankings, as well. In so doing, GUI engine 210 analyzes one or more lowly-ranked sample design options 126 and then ranks other design options 126 based on how dissimilar those design options 126 are to the lowly-ranked design options 126.

Once GUI engine 210 generates and populates tradeoff space 900, GUI engine 210 then analyzes the positioning of design options 126 within tradeoff space 900 to identify a subset 910 of design options 126 that are highly ranked according to one or both rankings 442. This subset 910 of design options 126 may satisfy the engineering and/or aesthetic standards or both users similarly or equally, or may represent a tradeoff between different engineering and/or aesthetic standards. GUI engine 210 can perform several different techniques to identify the subset of design options 126.

In one embodiment, GUI engine 210 may determine a Pareto frontier that includes design options 126 that maximize a metric that reflects both rankings 442(0) and 442(1). In another embodiment, GUI engine 210 may generate a convex hull that intersects design options 126 that minimize a total distance to both ranking axes 902(0) and 902(1). In yet another embodiment, GUI engine 210 may identify design options 126 that fall within a specific geometrically-shaped region or envelope of tradeoff space 900.

Via the techniques described above, GUI engine 210 automatically analyzes and visualizes tradeoffs between design options 126 based on different rankings 442. These techniques are especially useful when those rankings are very different or at odds with one another. In particular, different users with different engineering and/or aesthetic standards can rank design options 126 differently. GUI engine 210 facilitates cooperation between these different users by automatically identifying specific design options 126 that may satisfy the engineering and/or aesthetic standards of both users. The various techniques described above are described in greater detail below in conjunction with FIG. 10.

Figure 10:
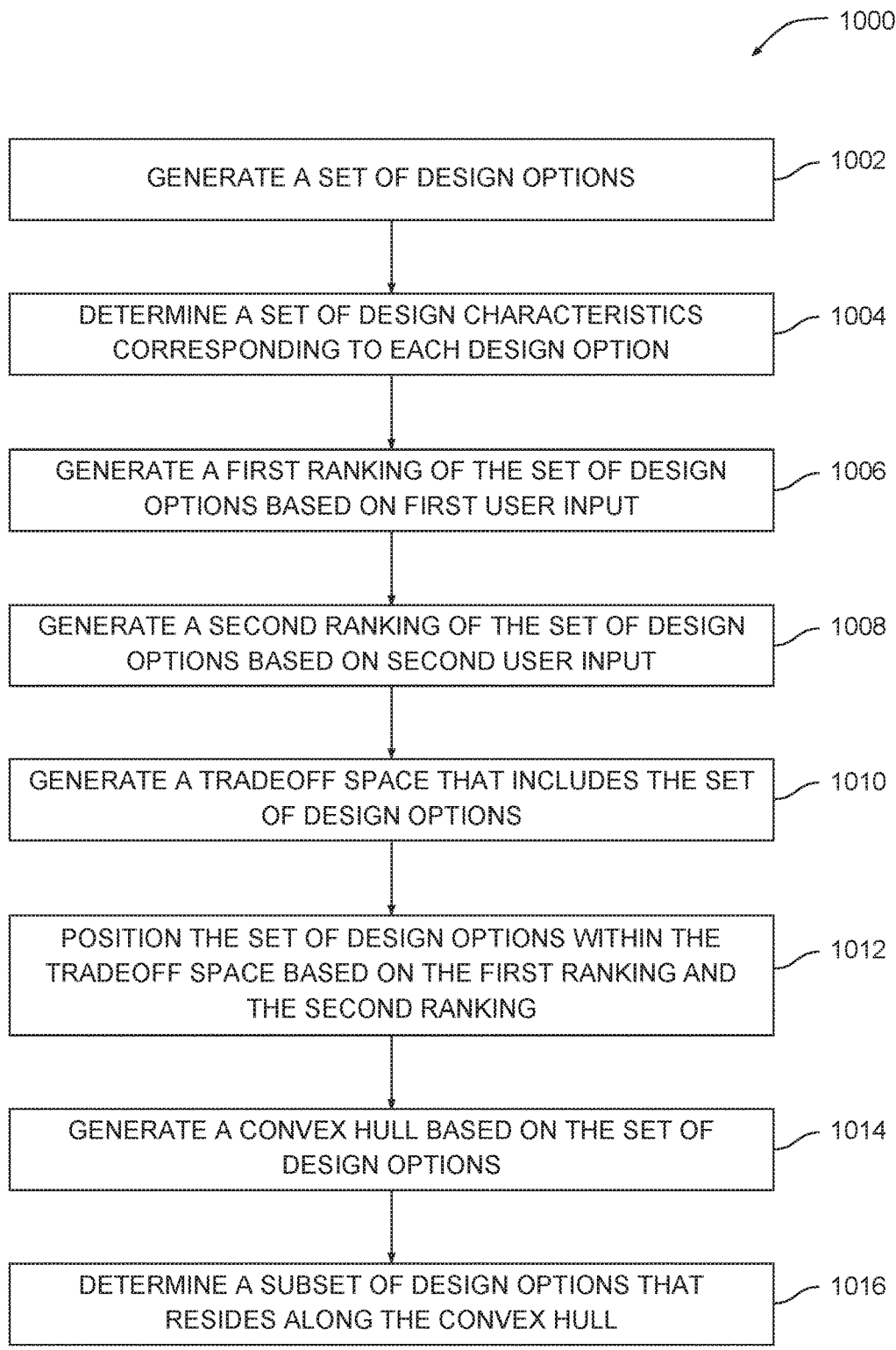
FIG. 10 is a flow diagram of method steps for generating a subset of design options having one or more competing design characteristics, according to various embodiments of the present invention.

FIG. 10 is a flow diagram of method steps for generating a subset of design options having one or more competing design characteristics, according to various embodiments of the present invention. Although the method steps are described in conjunction with the systems of FIGS. 1-2 and 9, persons skilled in the art will understand that any system configured to perform the method steps in any order falls within the scope of the present invention.

As shown, a method 1000 begins at step 1002, where generative design engine 200 of FIG. 2 generates a set of design options. Generative design engine 200 generates design space 124 and design options 126 based on problem definition 122 via a generative design process. Step 1002 is similar to step 802 of the method 800 described above in conjunction with FIG. 8.

At step 1004, GUI engine 210 determines a set of design characteristics corresponding to each design option. GUI engine 210 can analyze the physical properties of design options 126, evaluate geometrical attributes of design options 126, determine various engineering characteristics of design options 126, and so forth. As a general matter, at step 1004, GUI engine 210 determines any technically feasible set of emergent properties for each design option 126.

At step 1006, GUI engine 210 generates a first ranking of the set of design options based on first user input. In one embodiment, the first user input indicates a set of design options 126 that should be highly ranked and/or a set of design options 126 that should be lowly ranked. A first user could provide the first user input, for example, by manually ranking several design options 126. GUI engine 210 may analyze the first user input and rank other design options 126 based on how similar or dissimilar those other design options 126 are to the highly ranked and lowly ranked design options 126m, respectively. When determining similarity and/or dissimilarity between any two design options 126, GUI engine 210 may compare values for corresponding design characteristics associated with those design options 126.

At step 1008, GUI engine 210 generates a second ranking of the set of design options based on second user input. In one embodiment, the second user input indicates a set of design options 126 that should be highly ranked and/or a set of design options 126 that should be lowly ranked in like fashion as described above in conjunction with step 1006. A second user generally provides the second user input, although in some cases just one user can provide both the first user input and the second user input. In some cases, the first ranking and the second ranking can be significantly different from one another due to differences of opinion between the first user and the second user.

At step 1010, GUI engine 210 generates a tradeoff space that includes the set of design options. GUI engine 210 processes the first and second rankings generated at steps 1006 and 1008 and then organizes design options 126 within tradeoff space 900 based on those rankings. In doing so, GUI engine 210 configures each ranking axis 902 based on a different ranking and then positions each design option 126 relative to those ranking axes.

At step 1012, GUI engine 210 organizes the set of design options within the tradeoff space based on the first ranking and the second ranking. In one embodiment, for a given design option 126, GUI engine 210 may generate a set of Cartesian coordinates based on how the design option 126 is ranked in the first and second rankings. Then, GUI engine 210 positions the design option 126 within tradeoff space 900 based on those coordinates. As a general matter, the position of a given design option 126 within tradeoff space 900 reflects how the design option 126 is ranked according to both the first and second rankings.

At step 1014, GUI engine 210 generates a Pareto frontier based on the set of design options. The Pareto frontier may reside along a convex edge of an envelope that includes all design options 126. The Pareto frontier can be determined using any technically feasible set of techniques. In one embodiment, GUI engine 210 may compute a metric for each design option 126 based on the first and second rankings and then incrementally include design options 126 within the Pareto frontier that minimize the metric.

At step 1016, GUI engine 210 determines a subset of design options that resides along the Pareto frontier. The subset of design options 126 may correspond to design selections 128 shown in FIG. 1. The subset of design options 126 can also define the Pareto frontier when that frontier is computed using the technique described above in conjunction with step 1014. The subset of design options 126 may satisfy the engineering and/or aesthetic standards of both the first user and the second user, and therefore represent an equitable compromise between the different opinions held by each user. Persons skilled in the art will understand that the techniques described herein can be applied to explore tradeoffs between many different kinds of options beyond those associated with engineering design problems.

In sum, a design application is configured to visualize and explore large-scale generative design datasets. The design explorer includes a GUI engine that generates a design explorer, a composite explorer, and a tradeoff explorer. The design explorer displays a visualization of a multitude of design options included in a design space. The design explorer allows a user to filter the design space based on input parameters that influence a generative design process as well as various design characteristics associated with the different design options. The composite explorer displays a fully interactive composite of multiple different design options. The composite explorer exposes various tools that allow the user to filter the design space via interactions with the composite. The tradeoff explorer displays a tradeoff space based on different rankings of design options. The different rankings potentially correspond to competing design characteristics specified by different designers.

At least one technological advantage of the disclosed techniques relative to the prior art is that large-scale datasets commonly associated with a generative design process can be more effectively explored to identify design options that best meet engineering and/or aesthetic standards. Among other things, the disclosed techniques relieve designers of having to analyze each and every design option generated by generative design systems. Another technological advantage of the disclosed techniques is that design options are automatically analyzed relative to potentially competing design characteristics to determine a subset of design options that most effectively embodies those design characteristics. Accordingly, the disclosed techniques allow designers with differing opinions regarding which design options meet engineering and/or aesthetic standards to work together more effectively when evaluating and selecting designs. Accordingly, the disclosed techniques are especially useful for processing large-scale datasets, such as those typically associated with generative design projects. These technological advantages represent one or more technological advancements relative to prior art approaches.

1. Some embodiments include a computer-implemented method for analyzing options, the method comprising generating a tradeoff space that includes a set of options that indicates tradeoffs associated with a decision, and generating a subset of options that resides along a first boundary within the tradeoff space, wherein at least one option in the subset of options is ranked higher than every other option in the set of options according to at least one of a first ranking of the set of options and a second ranking of the set of options.

2. The computer-implemented method of clause 1, further comprising generating a first rank corresponding to a first option in the first set of options based on first user input, generating the first ranking based on the first rank, generating a second rank corresponding to the first option based on second user input, and generating the second ranking based on the second rank.

3. The computer-implemented method of any of clauses 1-2, further comprising generating a first set of coordinates for the first option based on the first rank and the second rank, wherein the first option is positioned within the tradeoff space based on the first set of coordinates.

4. The computer-implemented method of any of clauses 1-3, wherein the first rank indicates a degree to which the first option includes a first feature, and the second rank indicates a degree to which the second option includes a second feature.

5. The computer-implemented method of any of clauses 1-4, wherein generating the first ranking comprises computing one or more similarity values between the first option and one or more other options in the set of options, and ranking the set of options based on the one or more similarity values.

6. The computer-implemented method of any of clauses 1-5, further comprising evaluating a first objective function based on the at least one option to generate a first metric, wherein the first metric exceeds any other metric generated for any other option in the set of options.

7. The computer-implemented method of any of clauses 1-6, further comprising determining the first boundary by generating a convex hull associated with the set of options, and computing a portion of the convex hull that is oriented towards an intersection between a first axis and a second axis associated with the tradeoff space.

8. The computer-implemented method of any of clauses 1-7, further comprising computing the first boundary by determining a Pareto frontier associated with the set of options.

9. The computer-implemented method of any of clauses 1-8, further comprising generating the first set of options by filtering a plurality of options based on a first user interaction with a first composite image comprising the plurality of options.

10. The computer-implemented method of any of clauses 1-9, further comprising generating the first ranking based on a first set of weight values corresponding to the first set of options, wherein each weight value in the first set of weight values corresponds to a different characteristic feature associated with the set of options.

11. Some embodiments include a non-transitory computer-readable medium storing program instructions that, when executed by a processor, cause the processor to analyze options by performing the steps of generating a tradeoff space that includes a set of options that indicates tradeoffs associated with a decision, and generating a subset of options that resides along a first boundary within the tradeoff space, wherein at least one option in the subset of options is ranked higher than every other option in the set of options according to at least one of a first ranking of the set of options and a second ranking of the set of options.

12. The non-transitory computer-readable medium of clause 11, further comprising the steps of generating a first rank corresponding to a first option in the first set of options based on first user input, generating the first ranking based on the first rank, generating a second rank corresponding to the first option based on second user input, and generating the second ranking based on the second rank.

13. The non-transitory computer-readable medium of any of clauses 11-12, further comprising the step of generating a first set of coordinates for the first option based on the first rank and the second rank, wherein the first option is positioned within the tradeoff space based on the first set of coordinates.

14. The non-transitory computer-readable medium of any of clauses 11-13, wherein the first rank indicates a degree to which the first option includes a first feature, and the second rank indicates a degree to which the second option includes a second feature.

15. The non-transitory computer-readable medium of any of clauses 11-14, wherein generating the first ranking comprises computing one or more similarity values between the first option and one or more other options in the set of options, and ranking the set of options based on the one or more similarity values.

16. The non-transitory computer-readable medium of any of clauses 11-15, further comprising the step of evaluating a first objective function based on the at least one option to generate a first metric, wherein the first metric exceeds any other metric generated for any other option in the set of options.

17. The non-transitory computer-readable medium of any of clauses 11-16, further comprising generating the first set of options by filtering a plurality of options based on a first user interaction with a first composite image comprising the plurality of options.

18. The non-transitory computer-readable medium of any of clauses 11-17, further comprising generating the first composite image by rendering a set of images based on a set of three-dimensional models associated with the set of options, generating a different alpha value for each image in the set of images, and alpha-blending the set of images.

19. The non-transitory computer-readable medium of any of clauses 11-18, wherein the first option maximizes a first metric that is generated based on the first ranking and the second ranking.

20. Some embodiments include a system, comprising a memory that stores a software application, and a processor that executes the software application to perform the steps of generating a tradeoff space that includes a set of options that indicates tradeoffs associated with a decision, and generating a subset of options that resides along a first boundary within the tradeoff space, wherein at least one option in the subset of options is ranked higher than every other option in the set of options according to at least one of a first ranking of the set of options and a second ranking of the set of options.

21. The system of clause 20, wherein the decision corresponds to an engineering design problem, and the set of options corresponds to a set of design options.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for analyzing design options, the method comprising:
   generating a tradeoff space that displays a set of options based, at least in part, on a first ranking of the set of options and a second ranking of the set of options, wherein the first ranking is generated based, at least in part, on a selection of at least one option in the set of options by a first user, the second ranking is generated based, at least in part, on a selection of at least one option in the set of options by a second user, and each option included in the set of options comprises a design option that includes a geometrical structure; and
   generating a subset of options that resides along a first boundary within the tradeoff space, wherein at least one option in the subset of options is ranked higher than every other option in the set of options according to at least one of the first ranking of the set of options or the second ranking of the set of options.

2. The computer-implemented method of claim 1, further comprising:
   generating a first rank corresponding to a first option in the set of options based on first user input;
   generating the first ranking based, at least in part, on the first rank;
   generating a second rank corresponding to the first option based on second user input; and
   generating the second ranking based on the second rank.

3. The computer-implemented method of claim 2, further comprising generating a first set of coordinates for the first option based on the first rank and the second rank, wherein the first option is positioned within the tradeoff space based on the first set of coordinates.

4. The computer-implemented method of claim 2, wherein the first rank indicates a degree to which the first option includes a first feature, and the second rank indicates a degree to which the first option includes a second feature.

5. The computer-implemented method of claim 2, wherein generating the first ranking comprises:
   computing one or more similarity values between the first option and one or more other options in the set of options; and
   ranking the set of options based on the one or more similarity values.

6. The computer-implemented method of claim 1, further comprising evaluating a first objective function based on the at least one option in the subset of options selected by the first user to generate a first metric, wherein the first metric exceeds any other metric generated for any other option in the set of options.

7. The computer-implemented method of claim 1, further comprising determining the first boundary by:
   generating a convex hull associated with the set of options; and
   computing a portion of the convex hull that is oriented towards an intersection between a first axis and a second axis associated with the tradeoff space.

8. The computer-implemented method of claim 1, further comprising computing the first boundary by determining a Pareto frontier associated with the set of options.

9. The computer-implemented method of claim 1, further comprising generating the set of options by filtering a plurality of options based on a first user interaction with a first composite image comprising the plurality of options.

10. The computer-implemented method of claim 1, further comprising generating the first ranking based, at least in part, on a first set of weight values corresponding to the set of options, wherein each weight value in the first set of weight values corresponds to a different characteristic feature associated with the set of options.

11. The computer-implemented method of claim 1, wherein a display of the tradeoff space includes a first axis and a second axis, and wherein a first option in the set of options is displayed at a first position along the first axis based on the first ranking, and at a second position along the second axis based on the second ranking.

12. One or more non-transitory computer-readable media storing program instructions that, when executed by one or more processors, cause the one or more processors to analyze design options by performing the steps of:
    generating a tradeoff space that displays a set of options based, at least in part, on a first ranking of the set of options and a second ranking of the set of options, wherein the first ranking is generated based, at least in part, on a selection of at least one option in the set of options by a first user, the second ranking is generated based, at least in part, on a selection of at least one option in the set of options by a second user, and each option included in the set of options comprises a design option that includes a geometrical structure; and
    generating a subset of options that resides along a first boundary within the tradeoff space, wherein at least one option in the subset of options is ranked higher than every other option in the set of options according to at least one of the first ranking of the set of options or the second ranking of the set of options.

13. The one or more non-transitory computer-readable media of claim 12, further comprising the steps of:
    generating a first rank corresponding to a first option in the set of options based on first user input;
    generating the first ranking based, at least in part, on the first rank;
    generating a second rank corresponding to the first option based on second user input; and
    generating the second ranking based on the second rank.

14. The one or more non-transitory computer-readable media of claim 13, further comprising the step of generating a first set of coordinates for the first option based on the first rank and the second rank, wherein the first option is positioned within the tradeoff space based on the first set of coordinates.

15. The one or more non-transitory computer-readable media of claim 13, wherein the first rank indicates a degree to which the first option includes a first feature, and the second rank indicates a degree to which the first option includes a second feature.

16. The one or more non-transitory computer-readable media of claim 13, wherein generating the first ranking comprises:
    computing one or more similarity values between the first option and one or more other options in the set of options; and
    ranking the set of options based on the one or more similarity values.

17. The one or more non-transitory computer-readable media of claim 12, further comprising the step of evaluating a first objective function based on the at least one option in the subset of options selected by the first user to generate a first metric, wherein the first metric exceeds any other metric generated for any other option in the set of options.

18. The one or more non-transitory computer-readable media of claim 12, further comprising generating the set of options by filtering a plurality of options based on a first user interaction with a first composite image comprising the plurality of options.

19. The one or more non-transitory computer-readable media of claim 18, further comprising generating the first composite image by:
    rendering a set of images based on a set of three-dimensional models associated with the set of options;
    generating a different alpha value for each image in the set of images; and
    alpha-blending the set of images.

20. The one or more non-transitory computer-readable media of claim 12, wherein a first option maximizes a first metric that is generated based on the first ranking and the second ranking.

21. A system, comprising:
    one or more memories that store a software application; and
    one or more processors that execute the software application to perform the steps of:
        generating a tradeoff space that displays a set of options based, at least in part, on a first ranking of the set of options and a second ranking of the set of options, wherein the first ranking is generated based, at least in part, on a selection of at least one option in the set of options by a first user, the second ranking is generated based, at least in part, on a selection of at least one option in the set of options by a second user, and each option included in the set of options comprises a design option that includes a geometrical structure, and
        generating a subset of options that resides along a first boundary within the tradeoff space, wherein at least one option in the subset of options is ranked higher than every other option in the set of options according to at least one of the first ranking of the set of options or the second ranking of the set of options.

22. The system of claim 21, wherein the set of options indicates tradeoffs associated with a decision, wherein the decision corresponds to an engineering design problem, and the set of options corresponds to a set of design options that address the engineering design problem.

* * * * *

UNITED STATES PATENT AND TRADEMARK OFFICE
CERTIFICATE OF CORRECTION

PATENT NO. : 11,593,533 B2
APPLICATION NO. : 16/358635
DATED : February 28, 2023
INVENTOR(S) : Tovi Grossman et al.

It is certified that error appears in the above-identified patent and that said Letters Patent is hereby corrected as shown below:

In the Claims

Column 18, Claim 1, Line 14, please insert --receiving a first user selection of at least one design option included in a set of design options, wherein each design option included in the set of design options includes a geometrical structure; receiving a second user selection of at least one design option included in the set of design options;--;

Column 18, Claim 1, Line 14, please delete "a set of options" and insert --the set of design options--;

Column 18, Claim 1, Line 16, please delete "options and a second ranking of the set of options" and insert --design options and a second ranking of the set of design options--;

Column 18, Claim 1, Lines 18-19, please delete "a selection of at least one option in the set of options by a first user," and insert --the first user selection and--;

Column 18, Claim 1, Lines 20-23, please delete "a selection of at least one option in the set of options by a second user, and each option included in the set of options comprises a design option that includes a geometrical structure" and insert --the second user selection--;

Column 18, Claim 1, Line 24, please delete "options" and insert --design options--;

Column 18, Claim 1, Line 26, please delete "option in the subset of options" and insert --design option in the subset of design options--;

Column 18, Claim 1, Line 27, please delete "option in the set of options" and insert --design option in the set of design options--;

Column 18, Claim 1, Lines 28-29, please delete "options or the second ranking of the set of options" and insert --design options or the second ranking of the set of design options--;

Signed and Sealed this
Eighth Day of August, 2023

Katherine Kelly Vidal
*Director of the United States Patent and Trademark Office*

Column 18, Claim 2, Lines 32-33, please delete "option in the set of options based on first user input" and insert --design option in the set of design options based on first user selection--;

Column 18, Claim 2, Lines 36-37, please delete "option based on second user input" and insert --design option based on second user selection--;

Column 18, Claim 3, Line 41, please delete "option" and insert --design option--;

Column 18, Claim 3, Line 42, please delete "option" and insert --design option--;

Column 18, Claim 4, Line 46, please delete "option" and insert --design option--;

Column 18, Claim 4, Line 47, please delete "option" and insert --design option--;

Column 18, Claim 5, Lines 51-52, please delete "option and one or more other options in the set of options" and insert --design option and one or more other design options in the set of design options--;

Column 18, Claim 5, Line 53, please delete "options" and insert --design options--;

Column 18, Claim 6, Line 57, please delete "option in the subset of options selected by the" and insert --design option in the subset of design options selected by a--;

Column 18, Claim 6, Lines 59-60, please delete "option in the set of options" and insert --design option in the set of design options--;

Column 18, Claim 7, Line 64, please delete "options" and insert --design options--;

Column 19, Claim 8, Line 3, please delete "options" and insert --design options--;

Column 19, Claim 9, Lines 5-6, please delete "options by filtering a plurality of options" and insert --design options by filtering a plurality of design options--;

Column 19, Claim 9, Line 7, please delete "options" and insert --design options--;

Column 19, Claim 10, Line 11, please delete "options" and insert --design options--;

Column 19, Claim 10, Line 13, please delete "options" and insert --design options--;

Column 19, Claim 11, Lines 16-17, please delete "option in the set of options" and insert --design option in the set of design options--;

Column 19, Claim 12, Line 24, please insert --receiving a first user selection of at least one design option included in a set of design options, wherein each design option included in a set of design options includes a geometrical structure; receiving a second user selection of at least one design option included in the set of design options;--;

CERTIFICATE OF CORRECTION (continued)
U.S. Pat. No. 11,593,533 B2

Column 19, Claim 12, Line 24, please delete "a set of options" and insert --the set of design options--;

Column 19, Claim 12, Line 26, please delete "options and a second ranking of the set of options" and insert --design options and a second ranking of the set of design options--;

Column 19, Claim 12, Lines 28-29, please delete "a selection of at least one option in the set of options by a first user," and insert --the first user selection and--;

Column 19, Claim 12, Lines 30-33, please delete "a selection of at least one option in the set of options by a second user, and each option included in the set of options comprises a design option that includes a geometrical structure" and insert --the second user selection--;

Column 19, Claim 12, Line 34, please delete "options" and insert --design options--;

Column 19, Claim 12, Line 36, please delete "option in the subset of options" and insert --design option in the subset of design options--;

Column 19, Claim 12, Line 37, please delete "option in the set of options" and insert --design option in the set of design options--;

Column 19, Claim 12, Lines 38-39, please delete "options or the second ranking of the set of options" and insert --design options or the second ranking of the set of design options--;

Column 19, Claim 13, Lines 42-43, please delete "option in the set of options based on first user input" and insert --design option in the set of design options based on first user selection--;

Column 19, Claim 13, Lines 46-47, please delete "option based on second user input" and insert --design option based on second user selection--;

Column 19, Claim 14, Lines 51-52, please delete "option based on the first rank and the second rank, wherein the first option" and insert --design option based on the first rank and the second rank, wherein the first option design--;

Column 19, Claim 15, Line 57, please delete "option" and insert --design option--;

Column 19, Claim 15, Line 58, please delete "option" and insert --design option--;

Column 20, Claim 16, Lines 5-6, please delete "option and one or more other options in the set of options" and insert --design option and one or more other design options in the set of design options--;

Column 20, Claim 16, Line 7, please delete "options" and insert --design options--;

Column 20, Claim 17, Lines 11-12, please delete "option in the subset of options selected by the" and insert --design option in the subset of design options selected by a--;

CERTIFICATE OF CORRECTION (continued)
U.S. Pat. No. 11,593,533 B2

Column 20, Claim 17, Line 14, please delete "option in the set of options" and insert --design option in the set of design options--;

Column 20, Claim 18, Line 17, please delete "options by filtering a plurality of options" and insert --design options by filtering a plurality of design options--;

Column 20, Claim 18, Line 19, please delete "options" and insert --design options--;

Column 20, Claim 19, Line 24, please delete "options" and insert --design options--;

Column 20, Claim 20, Line 29, please delete "option" and insert --design option--;

Column 20, Claim 21, Line 37, please insert --receiving a first user selection of at least one design option included in a set of design options, wherein each design option included in the set of design options includes a geometrical structure, receiving a second user selection of at least one design option included in the set of design options,--;

Column 20, Claim 21, Line 37, please delete "options" and insert --design options--;

Column 20, Claim 21, Line 39, please delete "options and a second ranking of the set of options" and insert --design options and a second ranking of the set of design options--;

Column 20, Claim 21, Lines 41-42, please delete "a selection of at least one option in the set of options by a first user," and insert --the first user selection and--;

Column 20, Claim 21, Lines 43-47, please delete "a selection of at least one option in the set of options by a second user, and each option included in the set of options comprises a design option that includes a geometrical structure" and insert --the second user selection--;

Column 20, Claim 21, Line 48, please delete "options" and insert --design options--;

Column 20, Claim 21, Line 50, please delete "option in the subset of options" and insert --design option in the subset of design options--;

Column 20, Claim 21, Line 51, please delete "option in the set of options" and insert --design option in the set of design options--;

Column 20, Claim 21, Line 53, please delete "options or the second ranking of the set of options" and insert --design options or the second ranking of the set of design options--;

Column 20, Claim 22, Line 54, please delete "options" and insert --design options--;

Column 20, Claim 22, Line 57, please delete "options corresponds to a set of design options that" and insert --design options--.